United States Patent [19]

Elabd

[11] Patent Number: 4,803,710
[45] Date of Patent: Feb. 7, 1989

[54] STORAGE REGISTERS WITH CHARGE PACKET ACCUMULATION CAPABILITY, AS FOR SOLID-STATE IMAGERS

[75] Inventor: Hammam Elabd, Mercer County, N.J.

[73] Assignee: General Electric Company, Schenectady, N.Y.

[21] Appl. No.: 22,587

[22] Filed: Mar. 4, 1987

Related U.S. Application Data

[63] Continuation of Ser. No. 817,536, Jan. 9, 1986, abandoned.

[51] Int. Cl.$^4$ .................... G11C 19/28; H01L 29/78; H01L 27/14; H01L 31/00
[52] U.S. Cl. .......................................... 377/60; 357/24
[58] Field of Search ................. 357/24, 30; 377/57–63

[56] References Cited

U.S. PATENT DOCUMENTS

| | | | |
|---|---|---|---|
| 4,539,597 | 9/1985 | Kinoshita et al. | 357/24 LR |
| 4,547,677 | 10/1985 | Parker | 357/24 LR |
| 4,580,155 | 4/1986 | Tsoi et al. | 357/30 |

OTHER PUBLICATIONS

Masafumi Kimata et al., "A 480X 480 Element Image Sensor with a Charge Sweep Device" IEEE Int. Solid–State Circuits Conf., (2/85), Dig. Tech. Papers, pp. 100–101.

Sequin "Two-Dimensional Charge-Transfer Arrays" IEEE J. Solid-State Circuits vol. SC-9 (6/74) pp. 134–142.

*Primary Examiner*—Gene M. Munson
*Attorney, Agent, or Firm*—Henry I. Steckler; James C. Davis, Jr.; Paul R. Webb, II

[57] ABSTRACT

A CCD storage register for storing an area array of picture elements in a solid-state imager comprises a first set of charge transfer channels arranged in a parallel array with intervening spaces. Respective ones of a second set of charge transfer channels are located in spaces adjacent to the second set of charge transfer channels. Charge transfer stages in adjacent charge transfer channels in said first and second sets of charge transfer channels have corresponding charge storage sites between which connections for charge transfer can be made selectively. This allows shift and add procedures to be carried forward in the CCD storage register. The shift and add capability allows time-delay-integration procedures and true line interlacing procedures, as examples, to be carried forward in the CCD storage register.

17 Claims, 19 Drawing Sheets

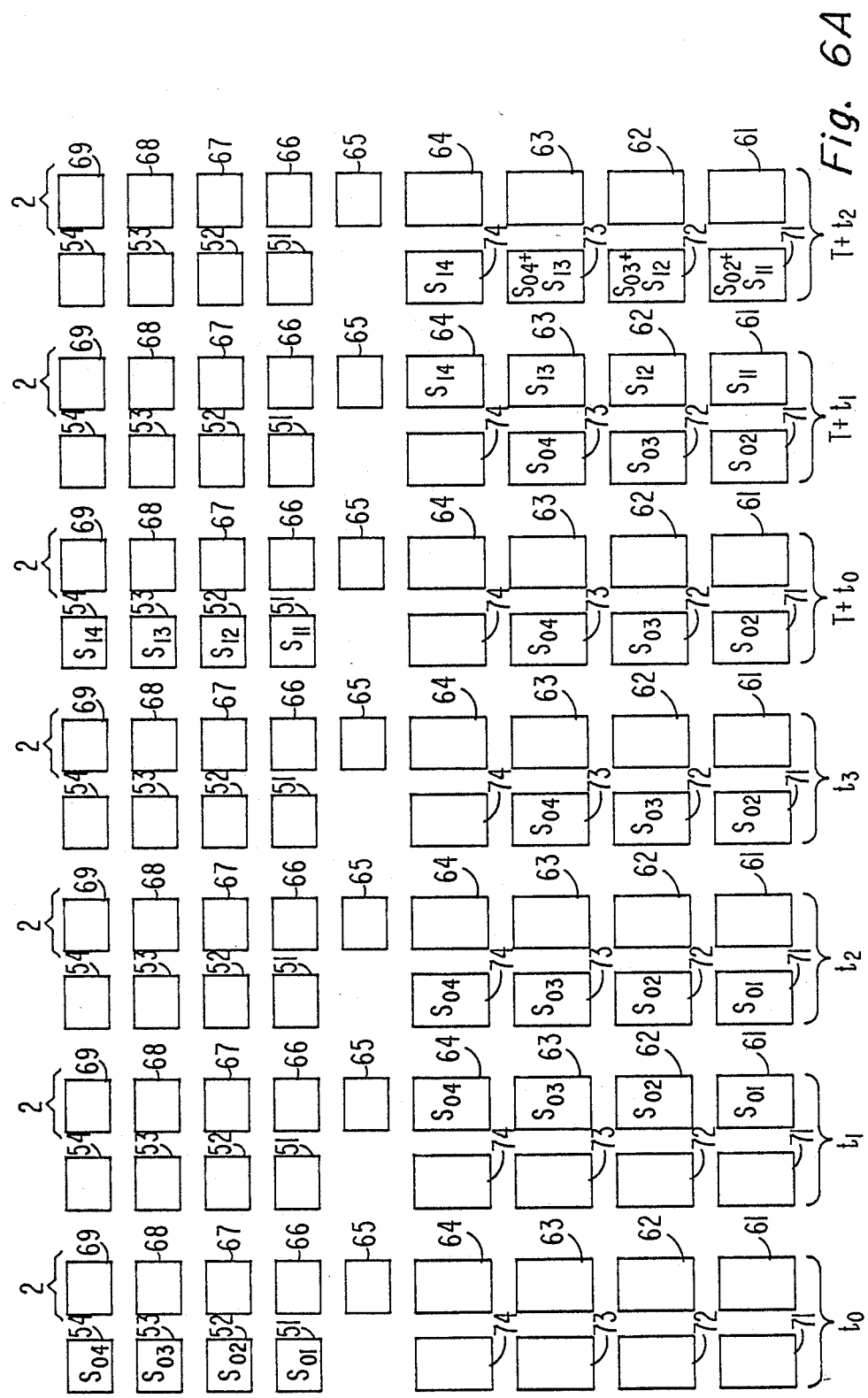

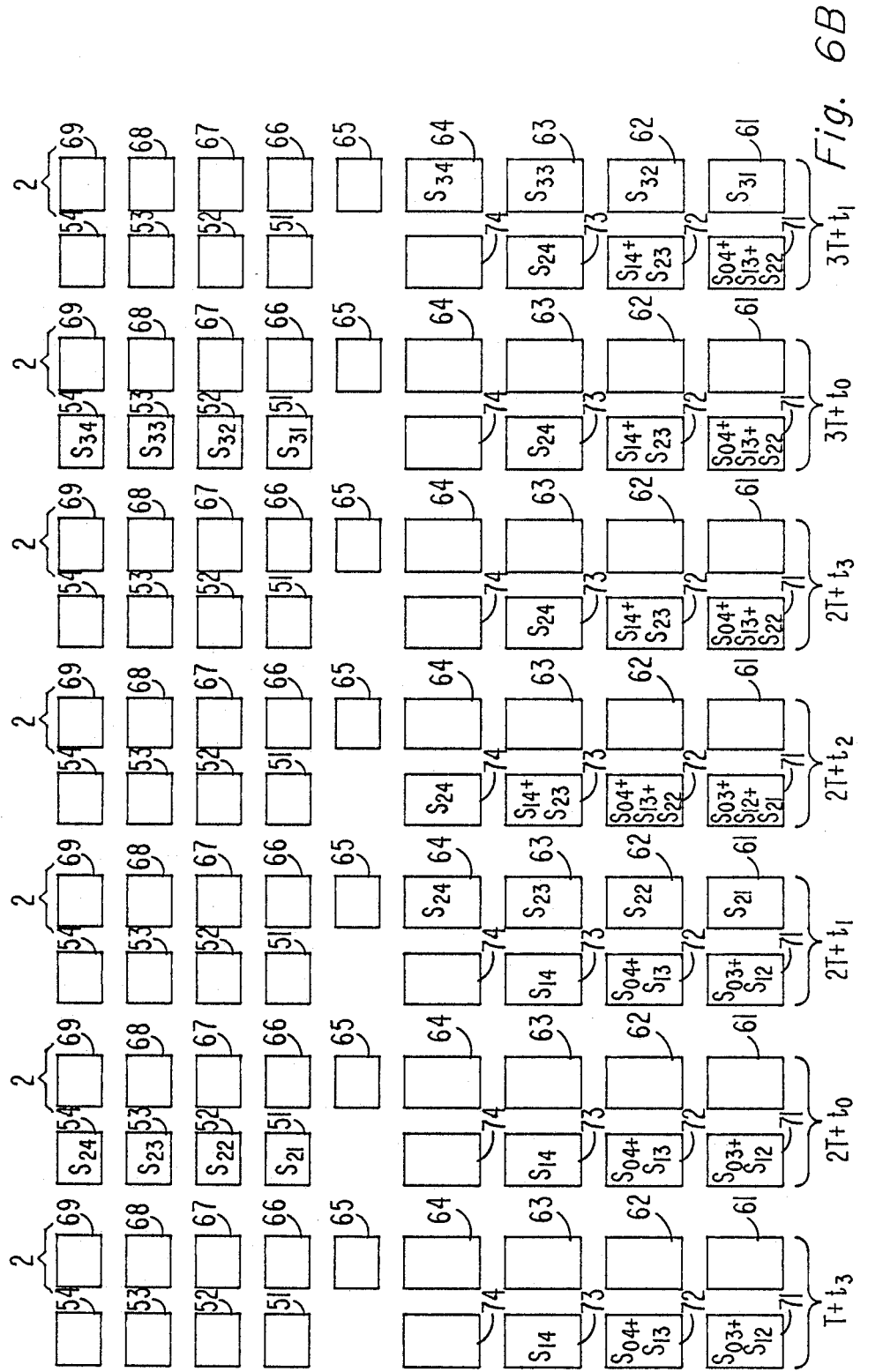

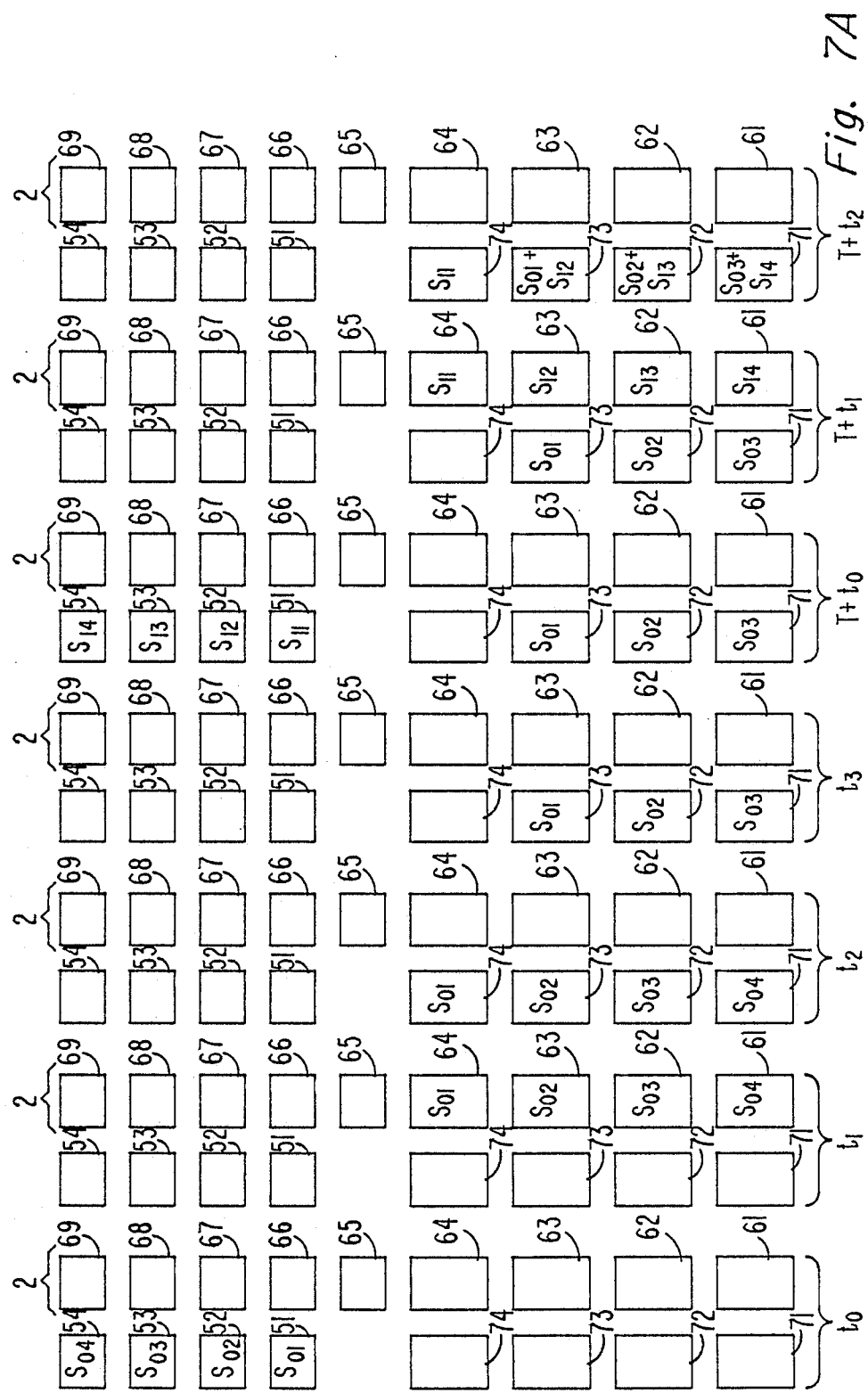

Fig. 7B

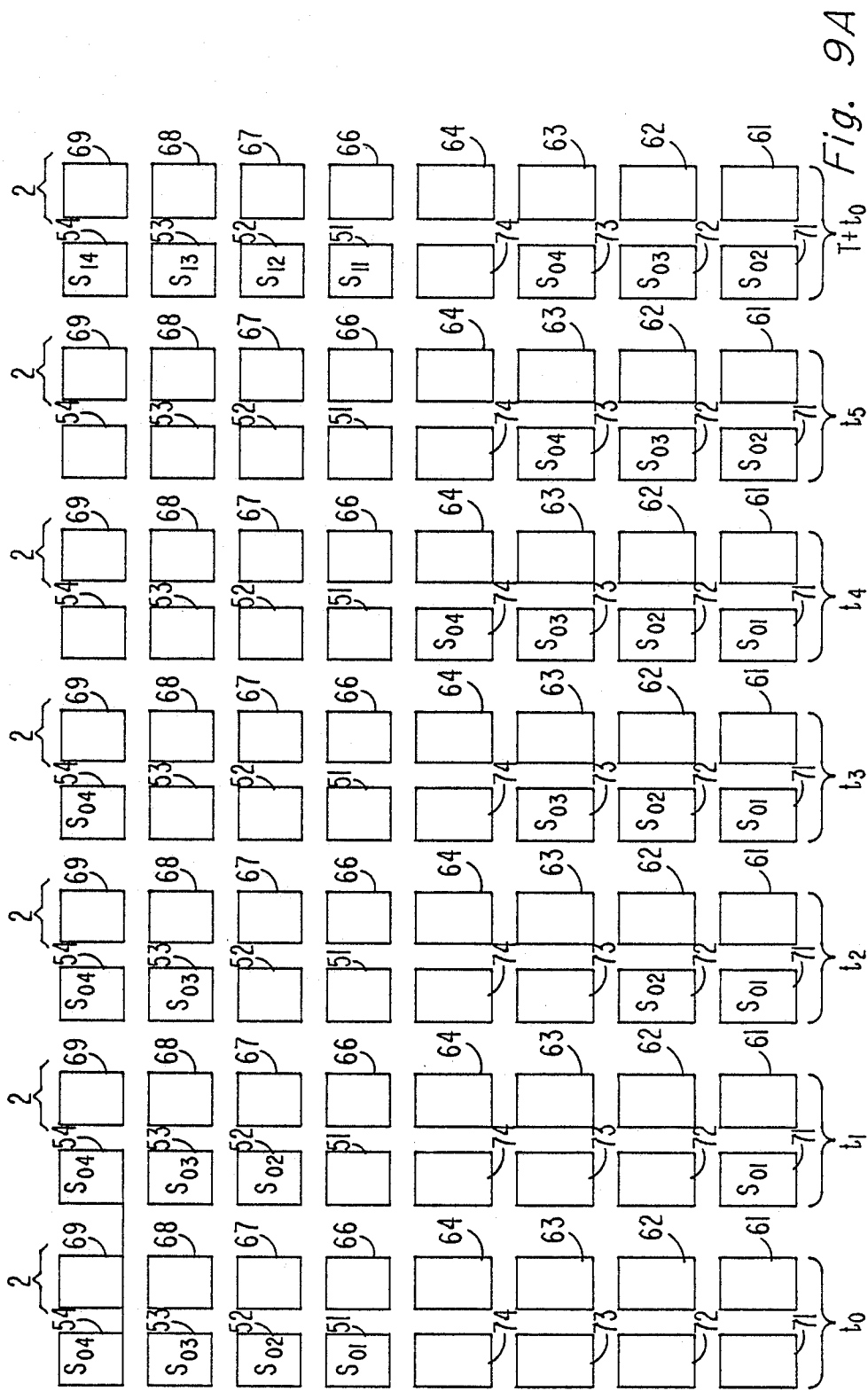

Fig. 9C

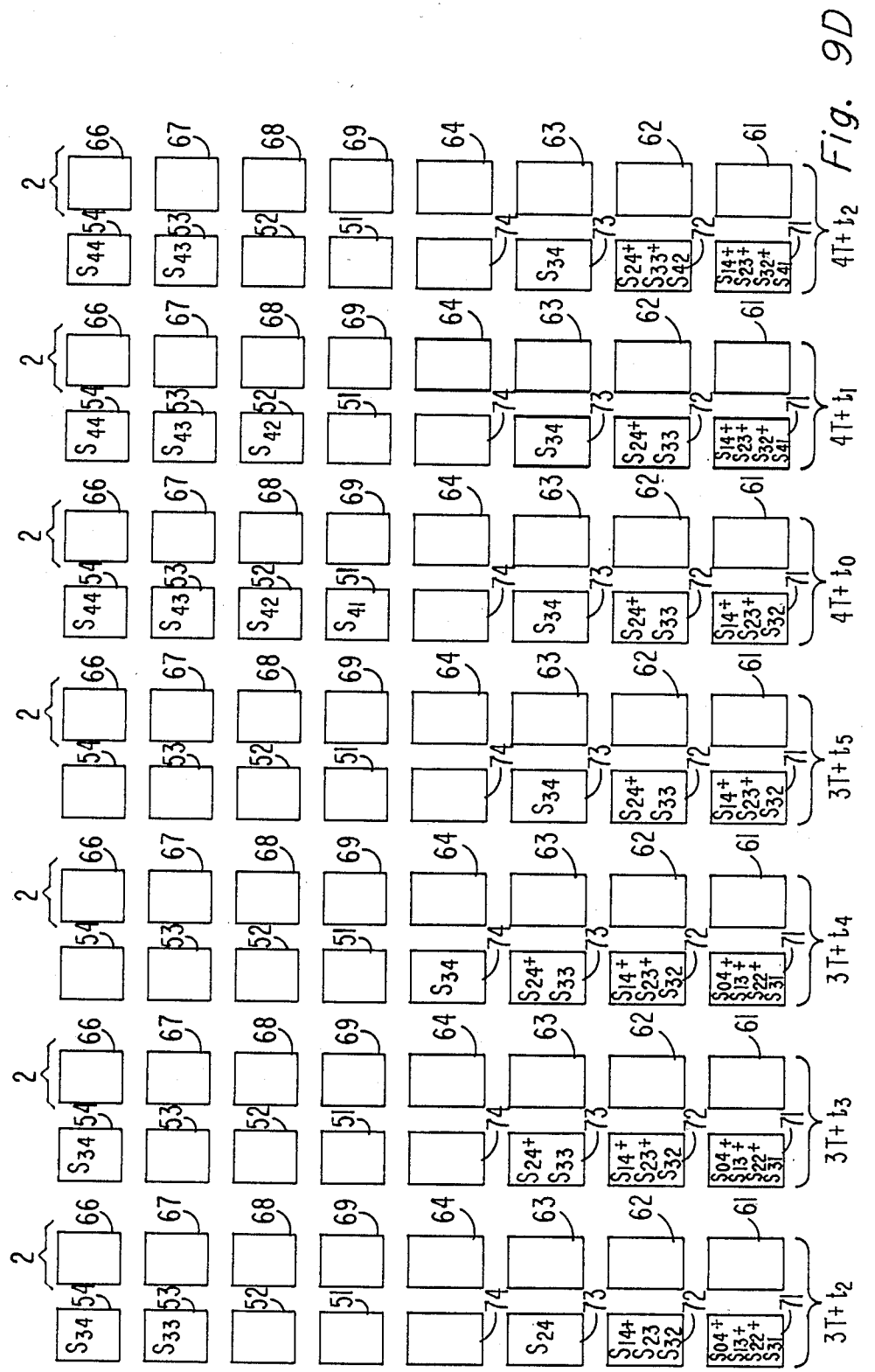

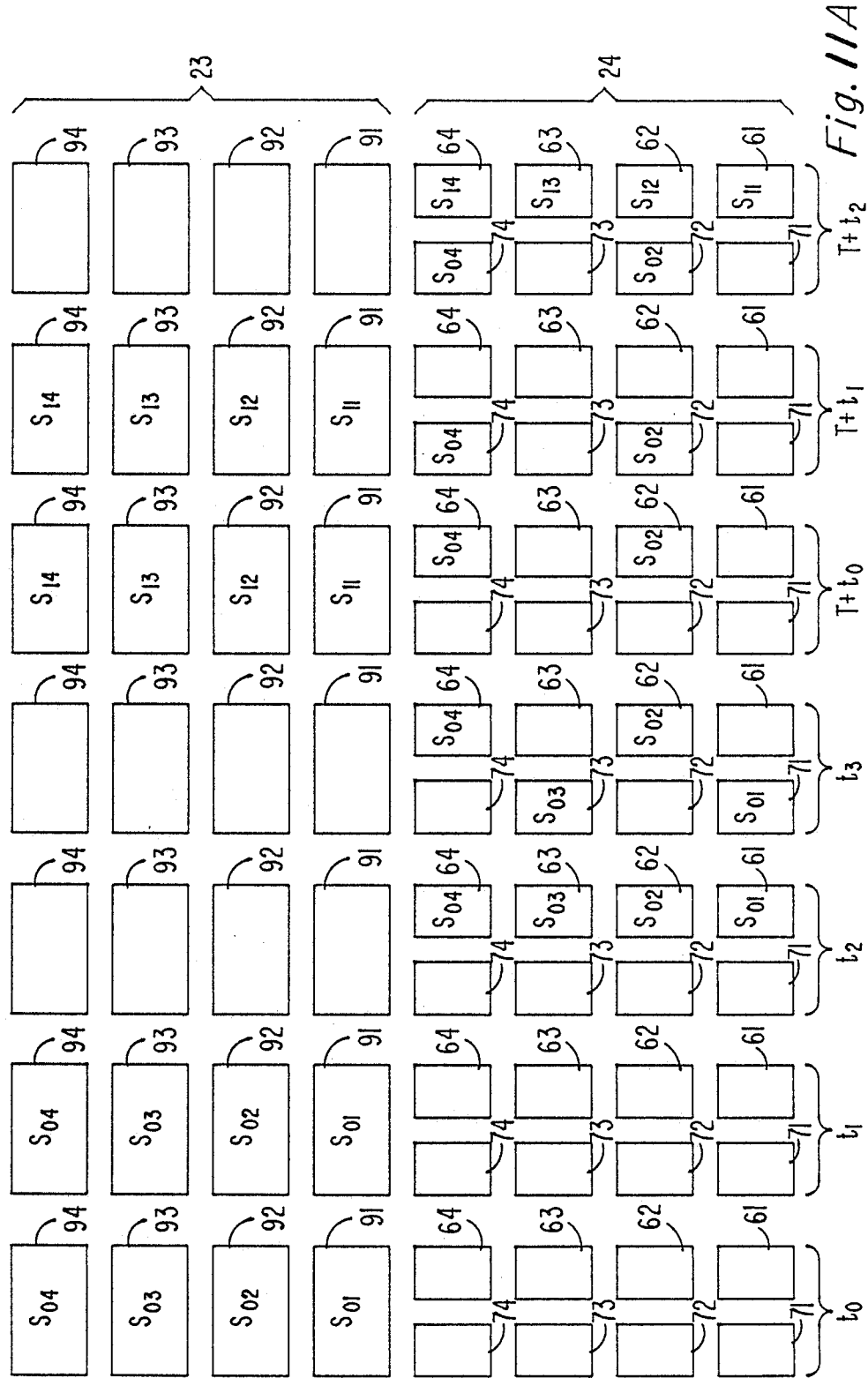

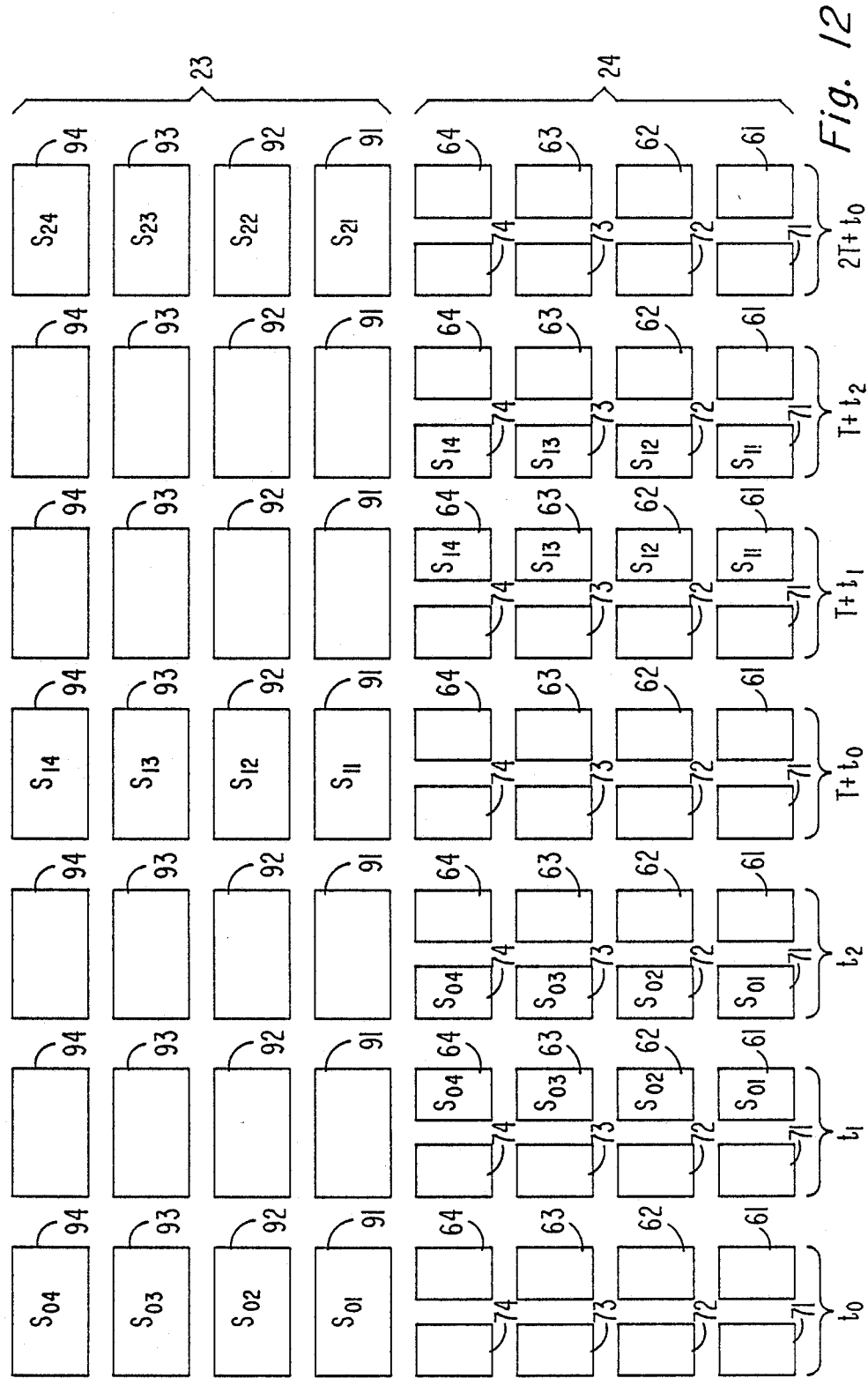

STORAGE REGISTERS WITH CHARGE PACKET ACCUMULATION CAPABILITY, AS FOR SOLID-STATE IMAGERS

This is a continuation of application Ser. No. 817,536, Jan. 9, 1986 now abandoned.

The invention relates to storage registers for solid-state imagers, and more particularly, to ones having the novel capability of accumulating charge packets to perform image processing. In the accumulating process, a charge packet already present in a charge-storage potential-energy well is augmented by another charge packet transferred into that well, which procedure may be repeated one or more times.

BACKGROUND OF THE INVENTION

A line imager typically comprises a line of photosensors for collecting photocharge and means for periodically carrying away the charge packets collected, then assembling them into serial format for sensing by a charge sensing circuit. The charge sensing circuit can be a floating-diffusion electrometer, for example; and the means for carrying charge packets to the electrometer can be charge-coupled device (CCD) circuitry. Line imagers may be operated to sense infrared, ultraviolet, or visible-light wavelengths. Line imagers can be operated with relative motion between the "platform" bearing them, and a field of view, to generate video signal samples that raster scan the field of view. In "pushbroom" operation the platform bearing the line register is scanned across the field of view in a direction perpendicular to the direction of the line image and the direction of normal incident light on the light imager. It is also common practice to use a scanning mirror to scan successive portions of a field of view and direct the scanned portions of the field of view to the line imager.

Schottky barrier diodes formed from a metal silicide contact to silicon are favored photosensors for infrared wavelengths. This is because these photosensors can be fabricated directly on the silicon die alongside the CCD circuitry required for charge transport, with only a few additional processing steps besides those processing steps required to fabricate the CCD circuitry and the charge sensing circuitry.

Photosensing for visible light, or near infrared, or both can be done with a silicon pn junction or in a potential energy well electrostatically induced in a portion of the surface of the silicon substrate apart from the CCD circuitry. When a visible-light-responsive solid-state imager is illuminated through its CCD-gate electrode-bearing surface, it is particularly desirable that photosensing be carried out in a portion of the imager apart from the CCD circuitry. This is because the gate electrodes will interfere with obtaining proper response in the blue wavelengths, despite their being made of phototransmissive polysilicon.

Collecting photocharge for only one line scan interval in a line imager tends to provide inadequate photosensor response unless the levels of photosensor irradiation (in the wavelengths the photosensors respond to) are relatively high. In this regard line imagers tend to be less satisfactory than area imagers, where photocharge collection times tend to be longer. On the other hand, the shorter time for photocharge collection tends to make the line imager better in responding to moving objects without blurring effects. Electronic cameras which use line sensors to scan a surface of revolution in a pushbroom operation are a natural choice for aerial reconnaissance and for observations of the earth from a satellite; the line sensors are less complex to make and operate than area sensors. Where photoconversion takes place in photosensors separate from the CCD charge transfer circuitry of the sensor, better fill factors can be obtained using the line sensor.

To obtain freedom from blurring on certain types of relative motion between the imager platform and the position of the image to which the imager generates photoresponse, but to still obtain longer photocharge collection times for improved sensitivity, a mode of imager operation referred to as "time delay integration" or "TDI" is often resorted to. An area array of photosensors is employed, which photosensors are arranged in a number m rows and a number n columns. CCD charge transfer channels are interleaved with the columns of photosensors to be used as interline transfer registers, each channel having a succession of m charge transfer stages therein, which charge transfer stages may be considered to be consecutively ordinally numbered first through $m^{th}$ in the direction of forward charge transfer. Photocharge is collected during line scan intervals and the charge packets are transferred in short register-loading intervals between line scan intervals, from each of first through $m^{th}$ rows of photosensors to a respective set of charge transfer stages of like ordinal number. This transfer is made after the previous charge packet contents of the charge transfer channels have been advanced by one charge transfer stage. The line of charge packets, transferred in parallel from the output ports of the interline charge transfer channels during this one stage advance, side-loads the successive charge stages of an output CD shift register. The forward clocking of the output CCD shift register is suspended during register-load invervals. During line scan intervals the output CCD shift register is forward clocked to transfer the charge packets serially to a charge sensing stage. Inasmuch as the image elements move across the photosensor array in the direction its columns are oriented, at the same speed that the charge packets are transferred in the interleaved charge transfer channels, image integration time is lengthened. This is an auto-correlation process that improves the sensitivity of the imager for those elements. Other elements of the image are spatially low-pass filtered by time delay integration in the direction perpendicualr to line scan. That is, they are blurred due to relative motion between them and the charge transfer process in the interline charge transfer channels. This effect is referred to as "TDI smear".

It is convenient to refer to the line scan interval and register-load interval as "line trace interval" and "line retrace interval", respectively, using the terms commonly used with regard to the kinescope displaying pictures generated from the video signal response of the CCD imager. This convention will be used throughout the rest of this disclosure.

The insertion of interline charge transfer channels between the columns of photosensors in the photosensor array introduces larger non-photosensitive areas into the imaging area, creating a less acceptable spatial alias and lowering fill factor. "Fill factor" is the percentage of the imaging area from which photocharge can actually be collected and directly affects the photo-efficiency of the imager. The interline charge transfer channels undesirably reduce the fill factor to 35% in typical prior-art line transfer CCD imagers. The loss of sensitivity in the imager due to poor fill factor is readily recovered by time delay integration, but the aliasing problem is not overcome. Further, in some imager applications it is desirable to be able to select between time delay integration and staring modes of operation, and increased sensitivity may be desired for the staring mode of operation.

A relatively new type of staring area imager is the "charge-sweep-device" or "CSD" imager. Such an imager has been described by M. Kimata et alii in a paper entitled "A 480×400 Element Image Sensor With a Charge Sweep Device" appearing in pages 100-101 of the DIGEST OF TECHNICAL PAPERS, 1985 IEEE INTERNATIONAL SOLID-STATE CIRCUITS CONFERENCE. The interline charge transfer channels are narrowed a few times in a CSD imager, allowing fill factors of 70%, for example. Charge packets are transferred a row at a time to the interline charge transfer channels, a successive one of the rows being transferred during each line retrace interval to be clocked forward in pixel scan rate during line trace interval to accumulate under a charge storage gate crossing the ends of the interline charge transfer channel. Individual charge packet transfers need not be complete at the pixel scan rate, so the interline charge transfer channels can be narrowed at the expense of efficient charge transfer, to allow closer packing of the columns of photosensors and thus increase the fill factor. During each line retrace interval, the line of charge packets accumulated under the storage gate is side-loaded into the output CCD shift register, to be clocked forward serially to the charge sensing circuit the succeeding line trace interval. The side-loading is carried out by lowering a potential energy barrier induced in the ends of the interline charge transfer channels, by changing the voltage on an overlying storage control gate interposed between the charge storage gate and the output CCD shift register, and then changing the voltage on the storage gate to reduce the depths of the potential energy wells induced thereunder.

The CSD imager, despite its attractiveness in reducing the non-photosensitive portion of the imaging area, cannot be operated in the time-delay-integration mode to increase its sensitivity still further. This is because only one line of charge packets can be transferred into and through the interline charge transfer channels during any time. A formidable technical problem is presented, then, by the desire to combine the advantages of CSD imaging and of TDI imaging.

The present inventor proposes to solve this problem with the CSD imager by using a new type of storage register inserted between the interline charge transfer channels and the output CCD shift register. This new type of storage register has the capability of accumulating successive charge packets supplied to it, which capability can be utilized to perform time-delay-integration.

This new type of storage register can also be used to perform other useful image processing functions. For example, this storage register can be used as a temporary frame storage register to provide true line interlace between alternate field scans in a frame-transfer type of imager. Prior art frame-transfer imagers are only capable of providing psuedo line interlace from field to field.

SUMMARY OF THE INVENTION

A CCD storage register embodying the invention in a first of its aspects comprises a first set of CCD charge transfer channels arranged in a parallel array with intervening spaces. The input ports of this first set of charge transfer channels are arranged for parallel transfer of charge packets to them. A second set of CCD charge transfer channels are each located adjacent to a corresponding one of the first set of CCD charge transfer channels. The output ports of this second set of charge transfer channels are arranged for parallel transfer of charge packets from them—e.g., to successive charge transfer stages of an output line register operated to convert charge packets from parallel-in-time format to serial-in-time format. Means are provided for selectively transferring charge packets from ones of the successive charge transfer stages in the first set of charge transfer channels to respective, corresponding ones of the successive charge transfer stages in the second set of charge transfer channels. These selective transfers are made on a row-selective basis in certain embodiments of the first aspect of the invention. In other embodiments they are made from all charge transfer stages in the first set of charge transfer channels to corresponding charge transfer stages in the second set of charge transfer channels.

A solid-state imager embodying the invention in a second of its aspects includes the CCD storage register just described, means for converting a radiant energy image into successive rows of charge packets sequentially supplied to the input ports of the first of each group of adjacent charge transfer channels in the CCD storage register, an output line register connected as suggested by way of example in the preceding paragraph, and charge sensing circuitry for sensing charge packets supplied to it serially-in-time from the output line register.

BRIEF DESCRIPTION OF THE DRAWING

FIGS. 6A-C are a set of timing diagrams for an imager of the type shown in FIG. 1, illustrating a method of carrying out time-delay-integration in the CCD storage register.

FIGS. 7A-C are a set of timing diagrams for an imager of the type shown in FIG. 1, illustrating another method of carrying out time-delay-integration in the CCD storage register. This method accommodates relative image motion in the direction opposite to that direction of relative image motion accommodated by the method illustrated in FIGS. 6A-C.

Figure 9C:
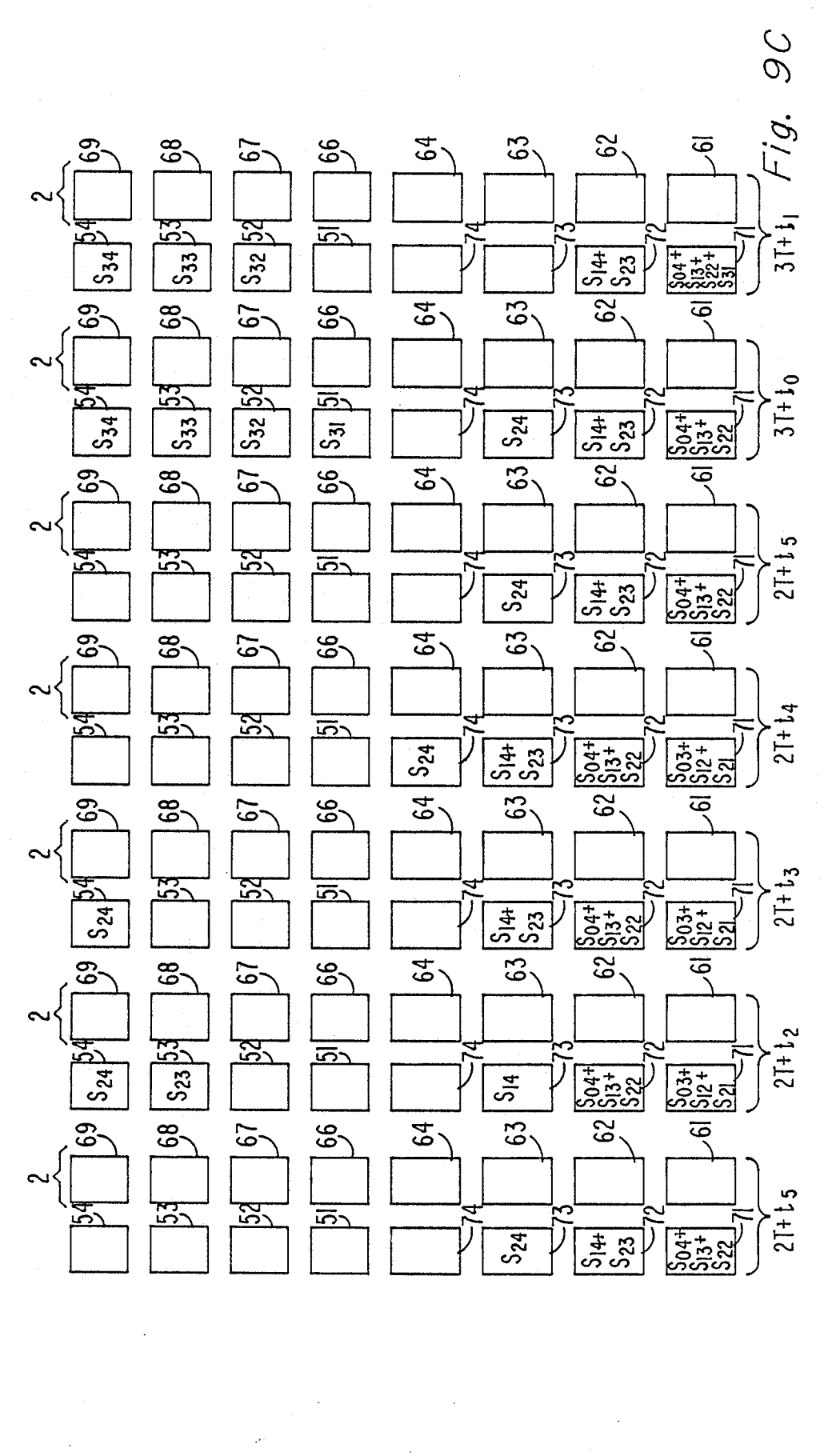

FIGS. 9A–D are a set of timing diagrams for an imager of the type shown in FIG. 8, illustrating a method for carrying out time-delay-integration in the CCD storage register.

FIGS. 11A and 11B are a set of timing diagrams for an imager of the type shown in FIG. 10, illustrating one method of achieving line interlace.

FIG. 12 is a timing diagram for an imager of the type shown in FIG. 10, illustrating one method of achieving pseudo line interlace.

DETAILED DESCRIPTION

Figure 1:
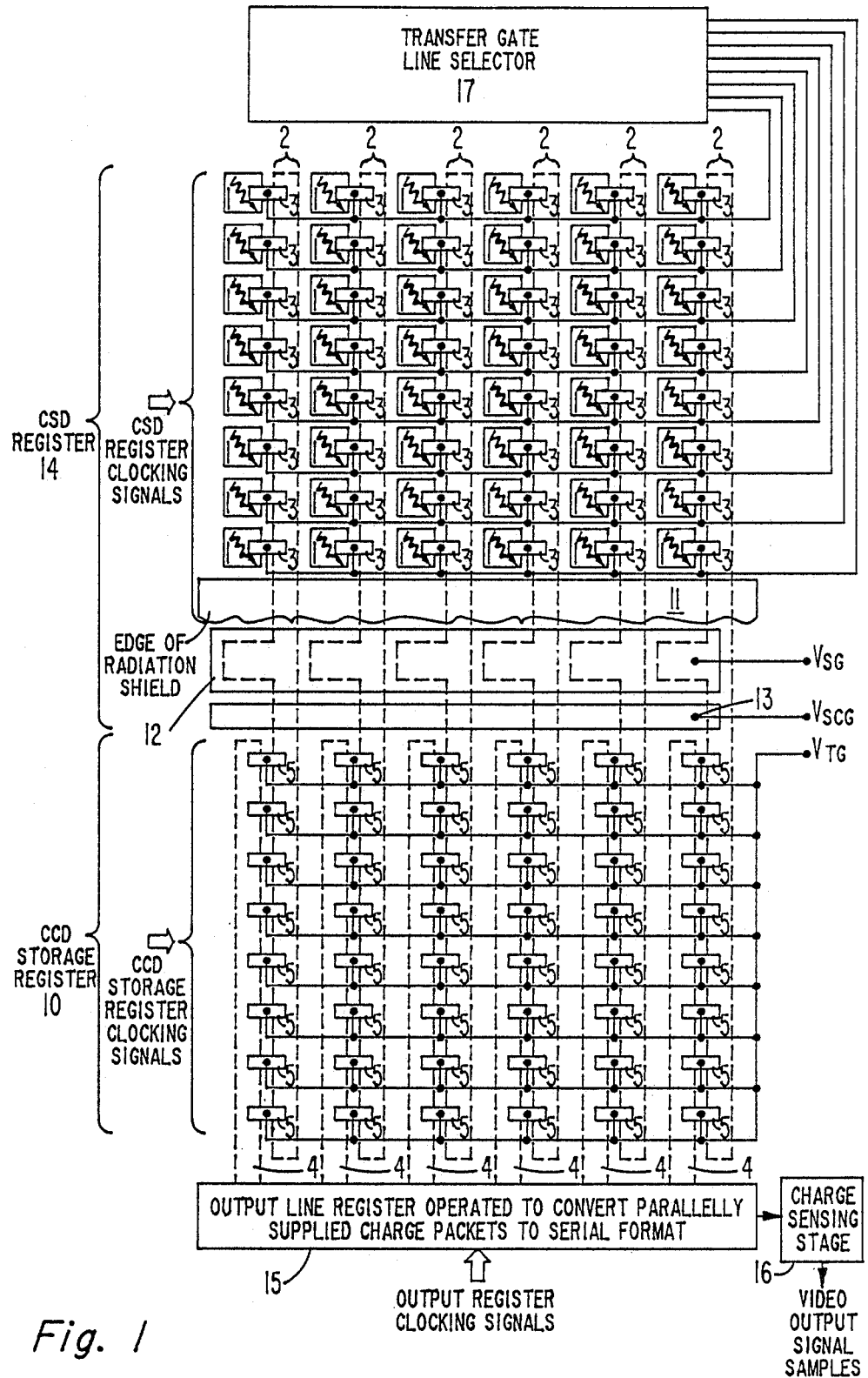
FIG. 1 is a block schematic diagram of a line imager embodying the invention. The infrared imager uses a CSD image register with Schottky-barrier diode photosensors, and it uses a CCD storage register with time-delay-integration capability between its image register and output CCD shift register.

In FIG. 1 a charge-sweep-device solid-state imager is modified to include a CCD storage register 10 in which time-delay-integration is performed in accordance with the invention. CCD storage register 10 is recurrently parallelly loaded with respective lines of charge packets. Each line of charge packets is clocked forward from charge storage wells induced in buried CCD charge transfer channels 2 under a storage gate electrode 12. During this clocking forward, the voltage $V_{SG}$ applied to electrode 12 is pulsed negatively from its normal relatively positive value to reduce the depth of the charge storage wells, and the voltage $V_{SCG}$ applied to a succeeding storage control gate electrode 13 is pulsed positively from its normal relatively negative value to lower the charge transfer barrier normally induced under electrode 13. (Storage gate electrode 12 and storage gate electrode 13, then, implement one possible form of an intermediate storage register, a line storage register in this instance.)

CCD storage register 10 recurrently side-loads the successive charge transfer stages of a CCD output line register 15 with respective charge packets. Each line of charge packets loaded from CCD storage register 10 is a time-delay-integration response to a plurality of the lines of charge packets previously clocked forward into register 10. After being parallelly loaded with a line of charge packets, the output line register 15 is operated as a CCD shift register to transfer the charge packets serially to a charge sensing stage 16 for conversion to respective samples of video output signal.

The CCD storage register 10 and CCD output line register 15 are usually covered by a radiation shield 11, a cutaway portion of which is shown in FIG. 1. This radiation shield 11 also extends over the storage and storage-control gate electrodes 12, 13 of CSD register 14. If the radiation to which the FIG. 1 imager is exposed is long enough in wavelength to be beyond the band of wavelengths to which silicon is photosensitive, radiation shield 11 need not be provided.

In the charge-sweep-device register 14 of the FIG. 1 imager, preceding CCD storage register 10, photosensors 1 are arrayed by row and by column. The photosensors 1 will be considered to be Schottky barrier diode infrared sensors in certain preferred embodiments of the invention, but may instead be another type of photosensor. Photosensors 1 may be visible-light responsive, infrared responsive, or both. (Each box representative of one of the photosensors 1 includes a wavy arrow representative of impinging radiation as well as the identification numeral 1 in its lower left corner.) A respective one of the buried CCD charge transfer channels 2, shown in dashed outline, parallels each column of photosensors 1 and comprises a succession of charge transfer stages corresponding to respective ones of the photosensors in the column the charge transfer channel 2 parallels. A respective transfer gate electrode 3 provides for selective connection of each photosensor 1 and its corresponding charge transfer stage in column CCD charge transfer channel 2. These selective connections may be surface-channel or buried-channel. The transfer gate electrodes 3 in each row connect in common to a respective bus to which a line selection signal is selectively applied by a transfer gate line selector 17.

Gate electrodes cross CCD charge transfer channels 2 and are receptive of CSD register clocking signals to cause the transfer of charge packets down the channels. Such conventional gate electrodes are not specifically shown in FIG. 1, to avoid cluttering the drawing. These gate electrodes cross the array of charge transfer channels from left to right, generally speaking, with different gate electrodes in each pitch sequence normally being made into a respective polysilicon layer, separated from the other polysilicon layers and the substrate surface by electrically insulative oxide layers. These gate electrodes are spread out in normal gate electrode pitch sequences over the charge transfer channels, but are arranged in a stack or sandwich structure to squeeze between the adjacent-row photosensors in each intervening column of photosensors 1. The transfer gate electrodes 3 may be integral with gate electrodes of one phase, as in the Kimata et alii CSD imager design, with transfer being controlled by transfer pulses superposed on normal forward clocking voltages for the CCDs comprising charge transfer channels 2. (If this is done, transfer gate line selector 17 will use tri-state bus drivers and CCD register 14 clocking signals will be supplied from another set of tri-state bus drivers.) Alternatively, transfer gate electrode voltages may be separately bussed to rows of transfer gate electrodes 3 from transfer gate line selector 17.

Transfer gate line selector 17 steps through a cycle of line selection steps at intermittent time intervals time T apart. The time duration of integration in each of the photosensors 1 is essentially T. Transfer gate line selector 17 conditions one of the rows of gate electrodes 3 at a time to allow transfer of charge under them. So photocharge packets collected in the photosensors 1 are selectively transferred by row through charge transfer channels 2 to be collected in respective potential energy wells induced at the ends of those channels 2 under the overlying storage gate electrode 12, then receptive of voltge $V_{SG}$ having its normal relatively positive value. The CSD register 14 charge transfer channels are generally made as narrow as possible and receive CSD register clocking signals of such high rate that charge from the selected row of photosensors 1 usually is transferred by a successive scooping or "charge sweep" process. The collected photocharge from each photosensor is transferred in a single charge packet, if small enough, or in a succession of charge packets, if larger, to be collected and re-integrated to a single charge packet in a potential-energy well induced under storage gate electrode 12.

Each line of charge packets collected in those wells under storage gate electrode 12 is then clocked forward into CCD storage register 10 at a clock rate, which is usually lower than CSD register clocking rate when TDI operation is employed. The CCD storage register 10 is clock rate is the rate at which transfer gate line selector 17 makes its successive line selections. This clock rate forward into CCD storage register 10 is high, however, in comparison to the rate 1/T at which each successive line of charge packets is completely clocked out of output line register 15 to charge sensing stage 16. So the lines of charge transferred out of CSD register 14 into CCD storage register 10 during one of the intermittent cycles of line selection can be considered to be essentially parallel in time.

In the CCD storage register 10 there are extensions of charge transfer channels 2 from charge-sweep-device register 14 to respective charge transfer stages in CCD output line register 15. These extensions of charge transfer channels 2 are parallelled by and spatially interleaved with a further set of charge transfer channels 4. These further charge transfer channels 4 have their output ports arranged to side-load respective ones of the successive charge transfer stages of the CCD output line register 15. The same succession of gate electrodes that crosses the extensions of charge transfer channels 2 into CCD storage register 10 also crosses the charge transfer channels 4, so the charge transfer channels 4 have successive charge transfer stages in rank with successive charge transfer stages in the extensions of charge transfer channels 2. Each charge transfer stage in one of charge transfer channels 4 has a respective transmission gate 5 allowing selective connection between it and a corresponding charge transfer stage in the one of the extensions of charge transfer channels 2 immediately to the right of it in FIG. 1. These selective connections may be surface-channel or buried-channel. The transfer gate electrodes 5 are connected in common bussing to receive a voltage $V_{TG}$, which is normally negative respective to substrate bias potential. So transfer gate electrodes 5 normally have potential energy barriers to charge transfer induced under them. Transfer gate electrodes 5, when pulsed relatively positive compared to their normal negative level, can enable charge transfer from each charge transfer stage in the extensions of charge transfer channels 2 (into CCD storage register 10) to a corresponding charge transfer stage in the one of charge transfer channels 4 immediately to its left in FIG. 1. Construction of transfer gate electrodes 5 is analogous to construction of transfer gate 3 electrodes, and their respective operations have similarities.

It may be desirable to provide anti-blooming structure in CCD storage register 10 to prevent blooming that might otherwise arise because of the summed charge packets exceeding the charge storage capacities in CCD register 10. Because of the charge sweep operation of CSD register 14 it is difficult to prevent blooming under all conditions just by using overflow drains with each of the photosensors 1.

In the operation of the FIG. 1 CCD imager it is desired to be able to control the transfer of charge packets by forward clocking independently in the charge transfer channels 4 and in the extensions of charge transfer channels 2 into CCD storage register 10. At the same time it is desired to use continuous gate electrode structures crossing all the charge transfer channels in CCD storage register 10 insofar as possible, to reduce the amount of top-metal bussing the imaging device requires. These desires can be satisfied by making the continuous gate electrode structures in the polysilicon layers that are closer to the semiconductor substrate, which structures receive all except one of the clocking voltage phases. The other phase of clocking voltage for the extensions of charge transfer channels 2 into CCD register 10, which shall be denominated $V_{CLK2}$, and the other phase of clocking voltage for the charge transfer channels 4, which shall be denominated $V_{CLK4}$, are applied to gate electrode structures 25 and 26, respectively (not shown in FIG. 1). Gate electrode structures 25 and 26 either are in a polysilicon layer more remote from the semiconductive substrate or are in top-metallization. The continuous gate electrode structures electrostatically shield portions of the substrate in propinquity to them from the electrostatic induction effects of these gate electrode structures 25 and 26 more remote from the substrate. So, gate electrode structures 25 may extend along the lengths of the extensions of charge transfer channels 2 into CCD storage register 10, but the gate electrode structures 25 will in any case provide the effect of a plurality of gate electrodes crossing these charge transfer channels in cyclic succession with the other gate electrodes. Gate electrode structures 26 may extend along the lengths of charge transfer channels 4 with similar effect.

Figure 2:
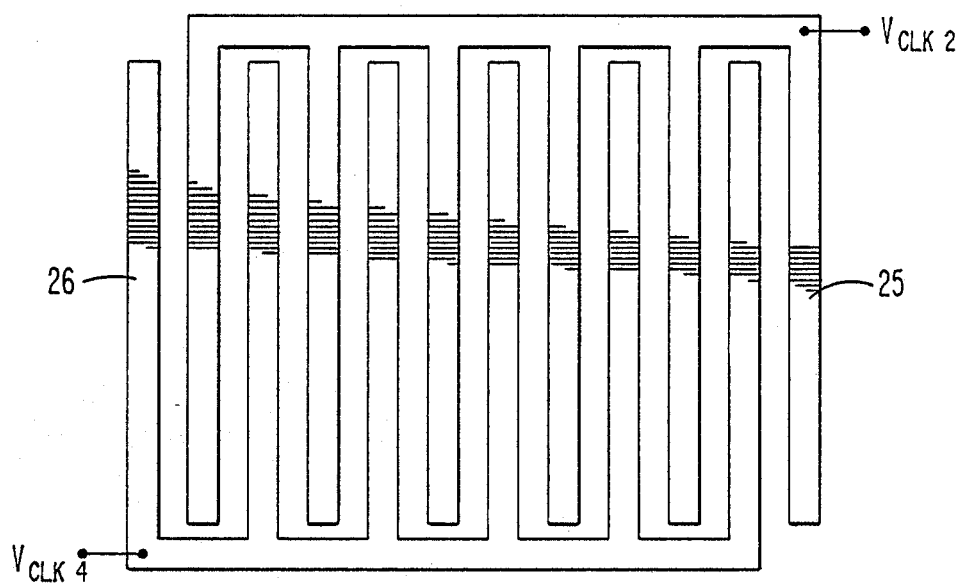
FIG. 2 is a plan view of top-layer gate electrode sturctures for the FIG. 1 CCD storage register.

FIG. 2 shows how gate electrode structures 25 and 26 may be realized as interdigitated comb structures. The teeth of comb structure 25 extend over the extensions of charge transfer channels 2 into CCD storage register 10. The teeth of comb structure 26 extend over the charge transfer channels 4 in CCD register 10. Top-metal strap connections may be made between the ends (or midpoints) of the teeth to lower gate electrode resistance and improve the time constants for $V_{CLK2}$ and $V_{CLK4}$ reaching more remote portions of the teeth, if necessary.

Figure 3:
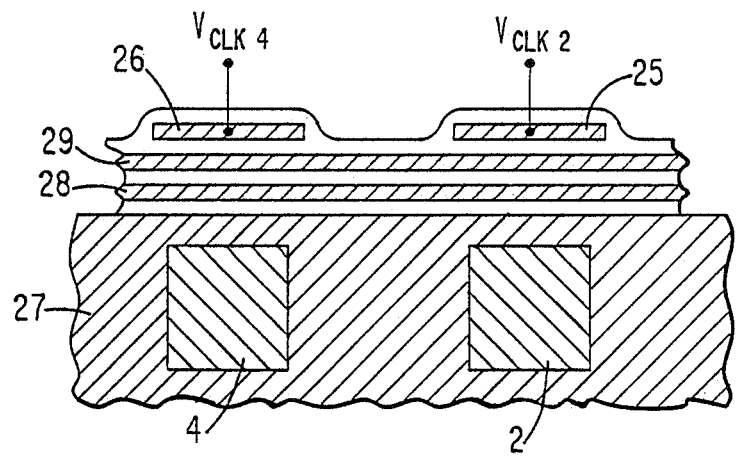
FIG. 3 and FIG. 4 are cross-sectional profile views of portions of the FIG. 1 CCD storage register, in which figures the vertical dimensions (per convention in such views) are in exaggerated scale compared to the horizontal dimensions.

FIG. 3 shows a profile cross-section of a portion of CCD storage register 10. This cross-section cuts through a portion of semiconductive substrate 27 and across an adjacent pair of charge transfer channels 2 and 4. Channel stop structures, not shown, isolate this pair of charge transfer channels from similar other pairs. The regions defining charge transfer channels 2 and 4 can be differentially doped to cause charge transfer to be unidirectional from charge transfer channels 2 to charge transfer channels 4. A three-phase clocked CCD storage register 10 is shown by way of example. One phase of clocking is applied to first-polysilicon-layer gate electrodes 28, isolated from substrate 27 by electric insulative material.. Another of the phases is applied to second-polysilicon-layer gate electrodes 29 isolated from substrate 27 and gate electrodes 28 by electrically insulative material. The remaining phase $V_{CLK2}$ of clocking voltage for the extensions of charge transfer channels 2 in CCD storage register 10 is selectively applied to the gate electrode structure 25 extending along the channel lengths and isolated from substrate 27 and gate electrodes 28, 29 by electrically insulative material. The remaining phase $V_{CLK4}$ of clocking voltage for charge transfer channels 4 is selectively applied to the gate electrode structure 26 extending along those channel lengths and isolated from substrate 27 and gate electrodes 28, 29 by electrically insulative material.

Figure 4:
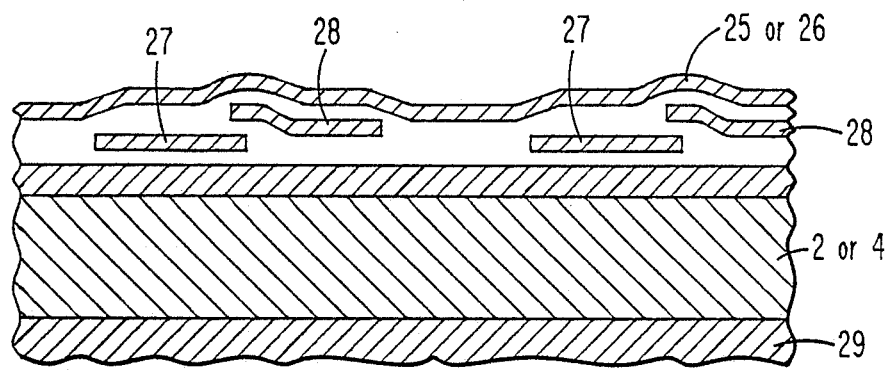

FIG. 4 shows a cross-section profile cutting through the middle of one of charge transfer channels 2 or 4.

Figure 5:
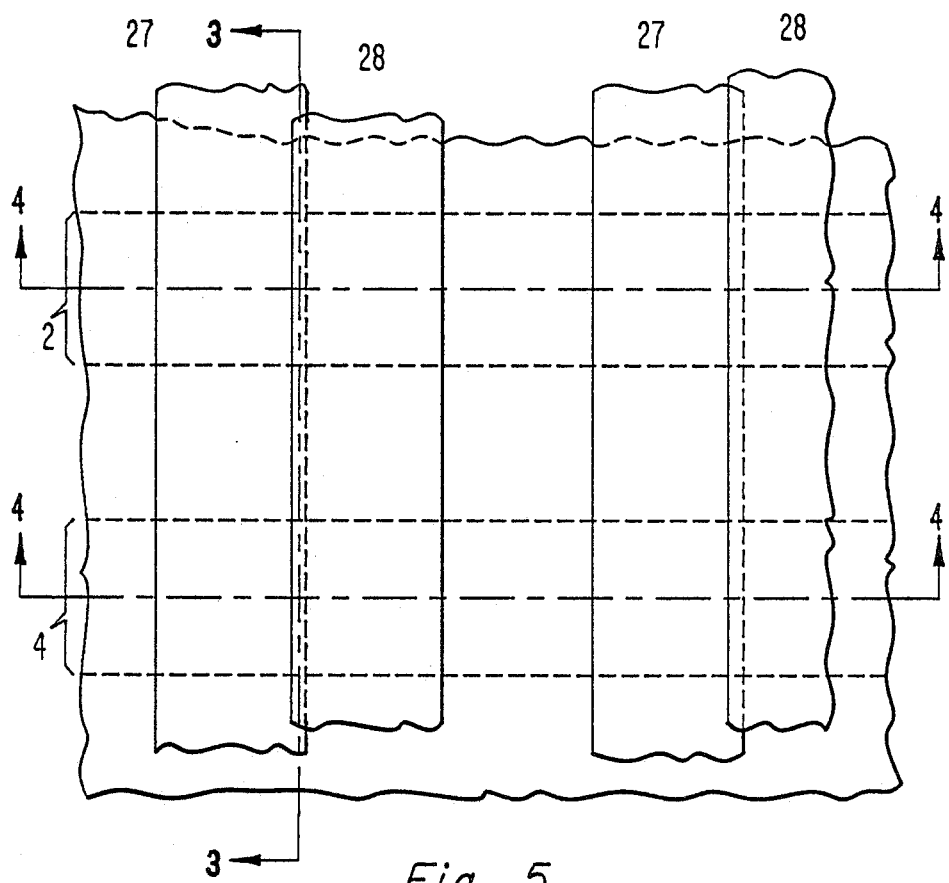
FIG. 5 is a plan view of a portion of the FIG. 1 CCD register, with top-layer gate electrode structures omitted to avoid confusion in interpreting the drawing.

FIG. 5 shows a plan view of an adjacent pair of charge transfer channels 2 and 4 in a portion of CCD storage register 10, on which the location of the FIG. 3 cross-sectional profile is indicated. Alternate locations of the FIG. 4 cross-sectional profile are also indicated.

More complex structures for constructing CCD storage register 10 can be envisioned by the skilled CCD designer, particularly if the number of clocking voltage phases is allowed to exceed three. Certain of these structures reduce the number of polysilicon layers in which the gate electrodes are defined. Certain of these structures remove the need for differentially doping the charge transfer channels 2 and 4 to determine direction of charge transfer, providing for that directionality by electrostatic induction from more complex gate electrode structures. Indeed, gate electrode structures which allow charge transfer between corresponding charge transfer stages in adjacent charge transfer channels 2 and 4 in either of the two possible directions, by simply changing clocking voltage phasing sequences are available. The thrust of the present invention, however, is concerned with a new overall architecture for CCD storage registers and the solid-state imagers employing them, rather than details of particular CCD designs.

Figure 6C:
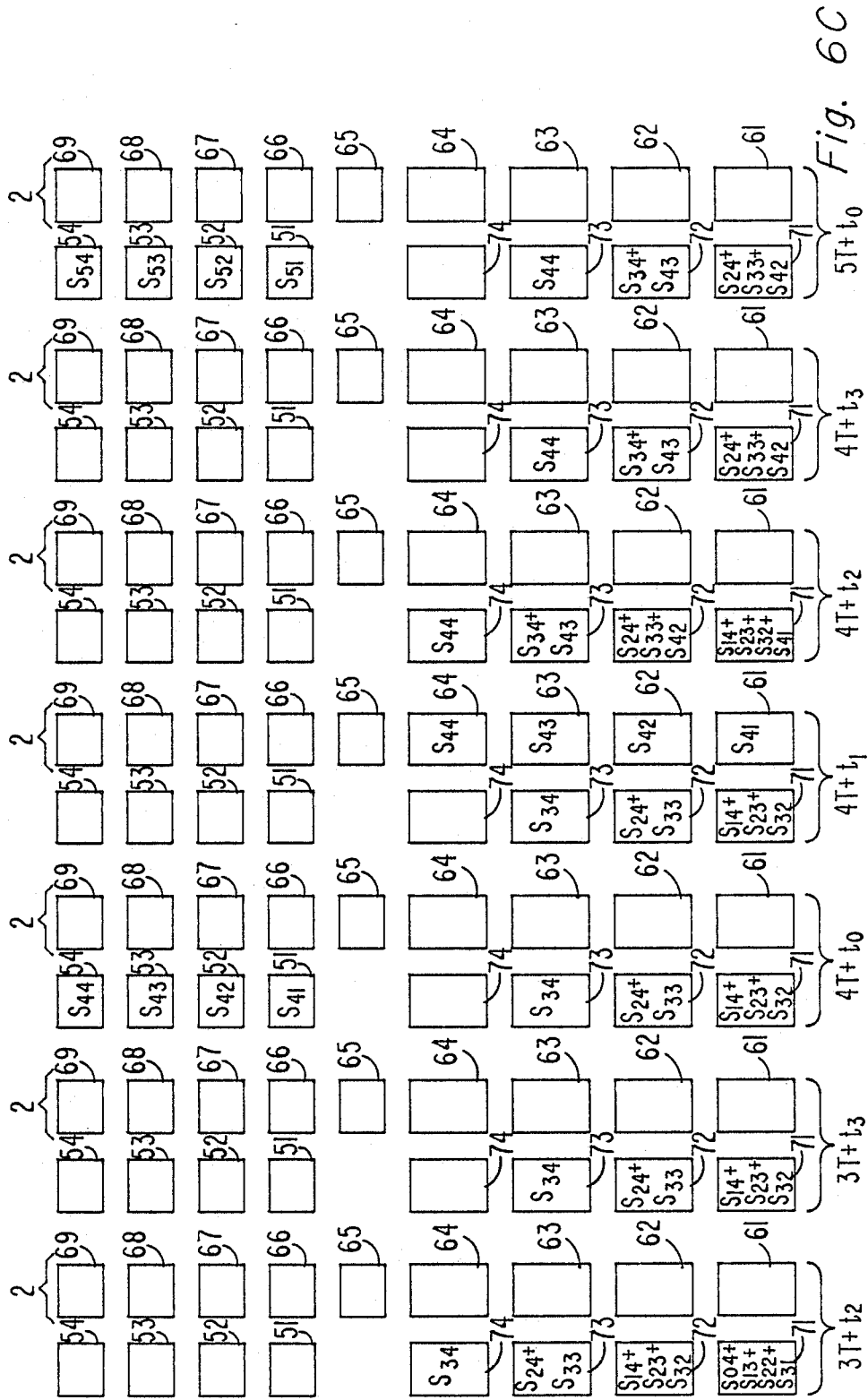

Refer to the timing diagrams of FIGS. 6A–C to understand how time-delay-integration is carried out in the FIG. 1 imager. The timing diagrams in this specification concern operation of one extended charge transfer channel 2, the charge transfer channel 4 immediately to its left in FIG. 1, and the associated photosensors. The eight-row registers of FIG. 1 would require timing diagrams of such complexity as to be difficult to draw and to understand, so four-row registers of a simpler imager will be considered in the timing diagrams. However, for convenience, the parts corresponding to those of the FIG. 1 imager will continue to be referred by the same identification numbers used in FIG. 1. In FIGS. 6A–C the boxes 51, 52, 52, 54 represent a column of photosensors in the CSD register 14.

The boxes representative of the charge transfer stages in the CSD register to which the photosensors 51–54 transfer charge are numbered 66–69, and the charge transfer stage under storage gate electrode 12 and storage-control gate electrode 13 is represented by box 65. The boxes 61–64 represent charge transfer stages in the extensions of the CSD register charge transfer channels 2, those which extend into the CCD storage register 10; and boxes 71–74 represent the charge transfer stages in the adjacent charge transfer channel 4 selectively connected by transmission gates 5 to the charge transfer stages 61–64, respectively.

Operation will be described with respect to the representative column structure of the FIG. 1 imager. Such operation parallels, in time, similar operations in the other column structures of the FIG. 1 imager.

At time $t_0$ in FIG. 6A the samples $S_{01}$, $S_{02}$, $S_{03}$ and $S_{04}$ descriptive of a column of image elements, have accumulated as charge packets over a preceding image integration interval of duration T. In denominating individual charge packets that are samples of image elements, the letter S followed by a two-digit subscript will be used. The first digit of the subscript indicates the ordinal number of the respective integration interval of length T, which intervals are consecutively numbered. The second digit of the subscript is the same as the last digit of the identification numeral of the one of the photosensors 51, 52, 53 or 54 in which the charge packet was originally accumulated. The times $t_1$, $t_2$, and $t_3$ follow time $t_0$ in close succession at intervals substantially shorter than T.

Between times $t_0$ and $t_1$, CSD operation takes place in the CSD register 14 of which photosensors 51, 52, 53 and 54 are a part. The CSD operation is as follows. The transmission gates 3 connecting the first row of photosensors (of which 51 is one) are rendered transmissive, and charge packets from the first row of photosensors 1 are swept out into the charge transfer channels 2 to accumulate as a first line of charge packets under the storage gate electrode 12 at the end of the CSD register (i.e. to be stored in charge transfer stage 65 and its counterparts). Then, after appropriate pulsing of the storage gate electrode 12 and its following storage control gate electrode 13, this first line of charge packets is clocked forward into the CCD storage register 10, to its fourth row including charge transfer stage 64. The transmission gates 3 connecting the second row of photosensors (of which 52 is one) are then rendered transmissive, and charge packets from the second row of photosensors 1 are swept out into the charge transfer channels 2 to accumulate as a second line of charge packets under the storage gate electrode 12. Then, this second line of charge packets is clocked forward into the CCD storage register 10, to its fourth row including charge transfer stage 64. Simultaneously, the charge packets originating in the first row of photosensors 1 are clocked forward into the third row of CCD storage register 10 including charge transfer stage 63. The transmission gates 3 connecting the third row of photosensors (of which 53 is one) are then rendered transmissive, and charge packets from the third row of photosensors 1 are swept out into the charge transfer channels 2 to accumulate as a third line of charge packets under the storage gate electrode 12. Then, this third line of charge packets is clocked forward into the CCD storage register 10, to its fourth row including charge transfer stage 64. Simultaneously, the charge packets previously in the fourth and third rows of CCD storage register 10 are transferred to positions in its third and second rows, respectively. The transmission gates 3 connecting the fourth row of photosensors (of which 54 is one) are then rendered transmissive, and charge packets from the fourth row of photosensors 1 are swept out into the charge transfer channels to accumulate as a fourth line of charge packets under the storage gate electrode 12. Then, this fourth line of charge packets is clocked forward into the CCD storage register 10, to its fourth row including charge transfer stage 64. Simultaneously, the charge packets originating in the third, second, and first rows of photosensors are transferred to positions in the third, second, and first rows of CCD storage register 10. These CSD operations take place in a relatively short period of time so the samples with the same first digit in their subscript are, practically speaking, obtained contemporaneously. At time $t_1$ the charge packets $S_{04}$, $S_{02}$, $S_{03}$, and $S_{04}$ repose in charge transfer stages 61, 62, 63, and 64 respectively.

Between times $t_1$ and $t_2$, the charge packet contents of charge transfer stages 61, 62, 63 and 64 in a charge transfer channel 2 extension are shifted into the corresponding charge transfer stages 71, 72, 73 and 74 of the adjacent charge transfer channel 4. In this instance there are presumed not to be previously stored charge packets in charge 71, 72, 73, 74 (as might be the case after a cap-up of the camera when image radiation is not permitted to reach the imager). Where there are previously stored charge packets, the newly admitted charge packets will merge with them to perform a set of sample addition steps parallel-in-time. This shift operation is carried out by pulsing the voltage $V_{TG}$ applied to the transmission gate electrodes 5 relatively positive compared to normal condition, to lower the potential energy barriers to charge transfer that are normally induced under the gate electrodes 5.

After time $t_2$ the storage register 10 is forward clocked one cycle to advance by one charge transfer stage each of the charge packets in the charge transfer channels 4 (and each of the null charge packets in the extensions of charge transfer channels 2 as well). In FIG. 6A this clocks $S_{01}$ charge packet out of storage register 10 (to side-load one of the charge transfer stages of output line register 15); and it advances the $S_{02}$, $S_{03}$, and $S_{04}$ charge packets to charge transfer stages 71, 72 and 73, respectively, giving rise to the conditions shown for time $t_3$.

Over an ensuing time interval of duration T a new packets $S_{11}$, $S_{12}$, $S_{13}$, and $S_{14}$ are accumulated in photosensors 51, 52, 53, and 54, respectively. The same set of charge packets sampling image operations described with respect to $S_{01}$, $S_{02}$, $S_{03}$, and $S_{04}$ elements as taking place between each of the successive times $t_0$, $t_1$, $t_2$ and $t_3$ are repeated with respect to $S_{11}$, $S_{12}$, $S_{13}$, and $S_{14}$ charge packets between each of the successive times $T+t_0$, $T+t_1$, $T+t_2$ and $T+t_3$. These operations are repeated at intervals T later for each successive set of charge packets sampling image elements.

In modulo-T time, then, these cyclically recurrent steps are as follows:

at time $t_0$ to $t_1$, charge sweep and forward clock operations are used to move charge packets descriptive of image samples into CCD storage register 10 charge transfer channel 2 extensions;

between times $t_1$ and $t_2$, charge packets sampling image are shifted from charge transfer stages in the extension of charge transfer channels 2 to corresponding charge transfer stages in charge transfer channels 4;

between times $t_2$ and $t_3$, each charge packet in charge transfer channel 4 is advanced one charge transfer stage, with charge packets transferred from the output ports of charge transfer channels 4 side-loading respective charge transfer stages in output line register 15; and between times $t_3$ and $T+t_0$, charge packets descriptive of a new-line of image samples accumulate in photosensors 1 (including 51–54), while output line line register 15 is forward clocked at pixel-scan rate to operate as a shift register for serially supplying to charge sensing stage 16 charge packets descriptive of the previous line of image samples.

With reference to FIG. 6C, the time-delay-integration results of these repeated operations begins to become evident at time $3T+t_2$. Between times $3T+t_2$ and $3T+t_3$, the charge packet shifted out of charge transfer stage 61 into the output line register 15 will equal $S_{04}+S_{13}+S_{22}+S_{31}$. Between times $4T+t_2$ and $4T+t_3$, the charge packet shifted out of charge transfer stage 61 will equal $S_{14}+S_{23}+S_{32}+S_{41}$. The charge packets shifted out of storage register 10 are progressively later in time as a function of lower row position in CSD register 14. This compensates for an upward motion of the imager platform relative to imager field of view, which motion is at a rate of one row per time interval T.

Figure 7B:
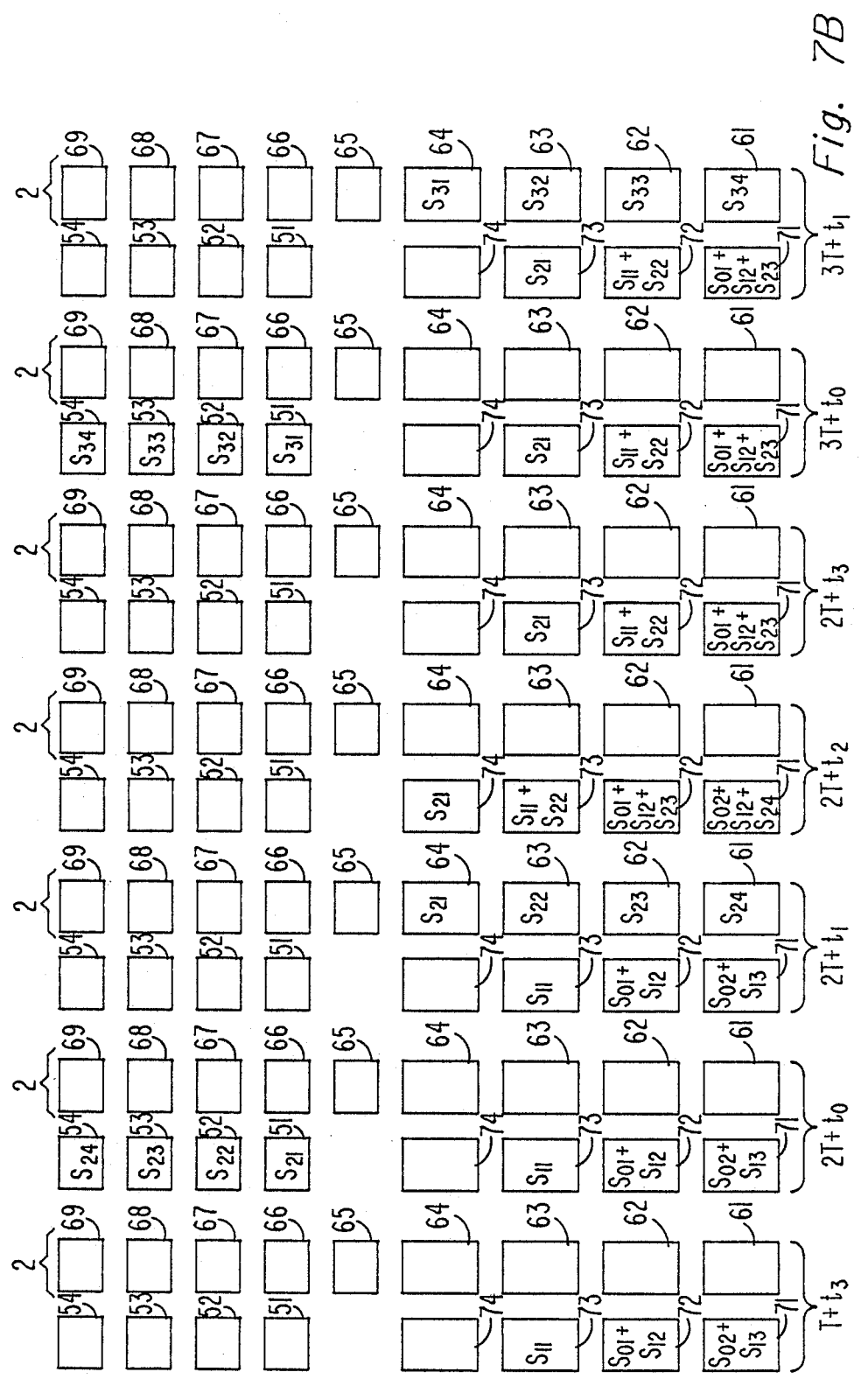
Figure 7C:
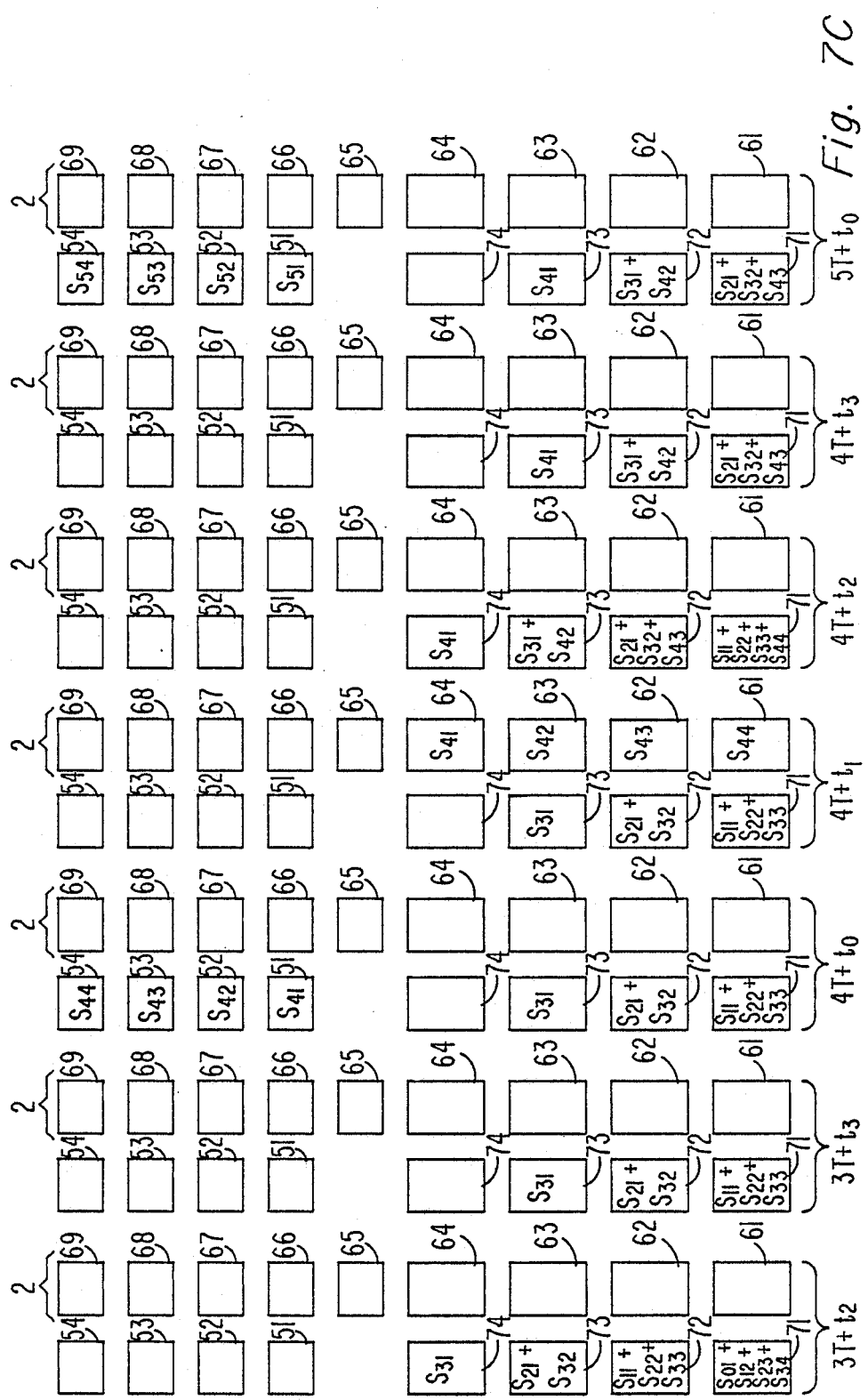

FIGS. 7A–C are referred to to understand how time-delay-integration is carried out in the FIG. 1 imager when it is desired to compensate for a downward motion of the imager platform relative to imager field of view, which motion is at a rate of one row per time interval T. Operation differs from that illustrated by FIGS. 6A–C in the CSD operation used to transfer charge packets descriptive of a column of image elements from the photosensors 1 into the CCD storage register 10 between the times $t_0$ and $t_1$ in modulo-T time.

This alternative mode of CSD operation is as follows. The transmission gates 3 connecting the fourth row of photosensors (of which 54 is one) are rendered transmissive, and charge packets from the fourth row of photosensors 1 are swept out into the charge transfer channels 2 to accumulate as a first line of charge packets under the storage gate electrode 12 at the end of the CSD register (i.e. in charge transfer stage 65 and its counterparts). Then after appropriate pulsing of the storage gate electrode 12 and its following storage control gate electrode 13, this first line of charge packets is clocked forward into the CCD storage register 10, to its fourth row including charge transfer stage 64. The transmission gates 3 connecting the third row of photosensors (of which 53 is one) are then rendered transmissive, and charge packets from the third row of photosensors 1 are swept out into the charge transfer channels 2 to accumulate as a second line of charge packets under the storage gate electrode 12. Then, this second line of charge packets is clocked forward into the CCD storage register 10, to its fourth row including charge transfer stage 64. Simultaneously, the charge packets originating in the fourth row of photosensors 1 are clocked forward into the third row of CCD storage register 10 including charge transfer stage 63. The transmission gates 3 connecting the second row of photosensors (of which 52 is one) are then rendered transmissive, and charge packets from the second row of photosensors 1 are swept out into the charge transfer channels 2 to accumulate as a third line of charge packets under the storage gate electrode 12. Then, this third line of charge packets is clocked forward into the CCD storage register 10, to its fourth row including charge transfer stage 64. Simultaneously, the charge packets previously in the fourth and third rows of CCD storage register 10 are transferred to positions in its third and second rows, respectively. The transmission gates 3 connecting the first row of photosensors (of which 51 is one) are then rendered transmissive, and charge packets from the first row of photosensors 1 are swept out into the charge transfer channels to accumulate as a fourth line of charge packets under the storage gate electrode 12. Then, this fourth line of charge packets is clocked forward into the CCD storage register 10, to its fourth row including charge transfer stage 64. Simultaneously, the charge packets originating in the second, third and fourth rows of photosensors are transferred to positions in the third, second, and first rows of CCD storage register 10. These CSD operations take place in a relatively short period of time so the samples with the same first digit in their subscript are, practically speaking, obtained contemporaneously. At time $t_1$ the charge packets $S_{01}$, $S_{02}$, $S_{03}$, and $S_{04}$ repose in charge transfer stages 64, 63, 62, and 61 respectively.

Patterns of CSD operation more complex than these used in FIGS. 6A–C and in FIGS. 7A–C may be used to follow oscillatory image motion. More complex patterns of CSD operation may also be used to perform low-pass spatial filtering of stationary images.

Figure 8:
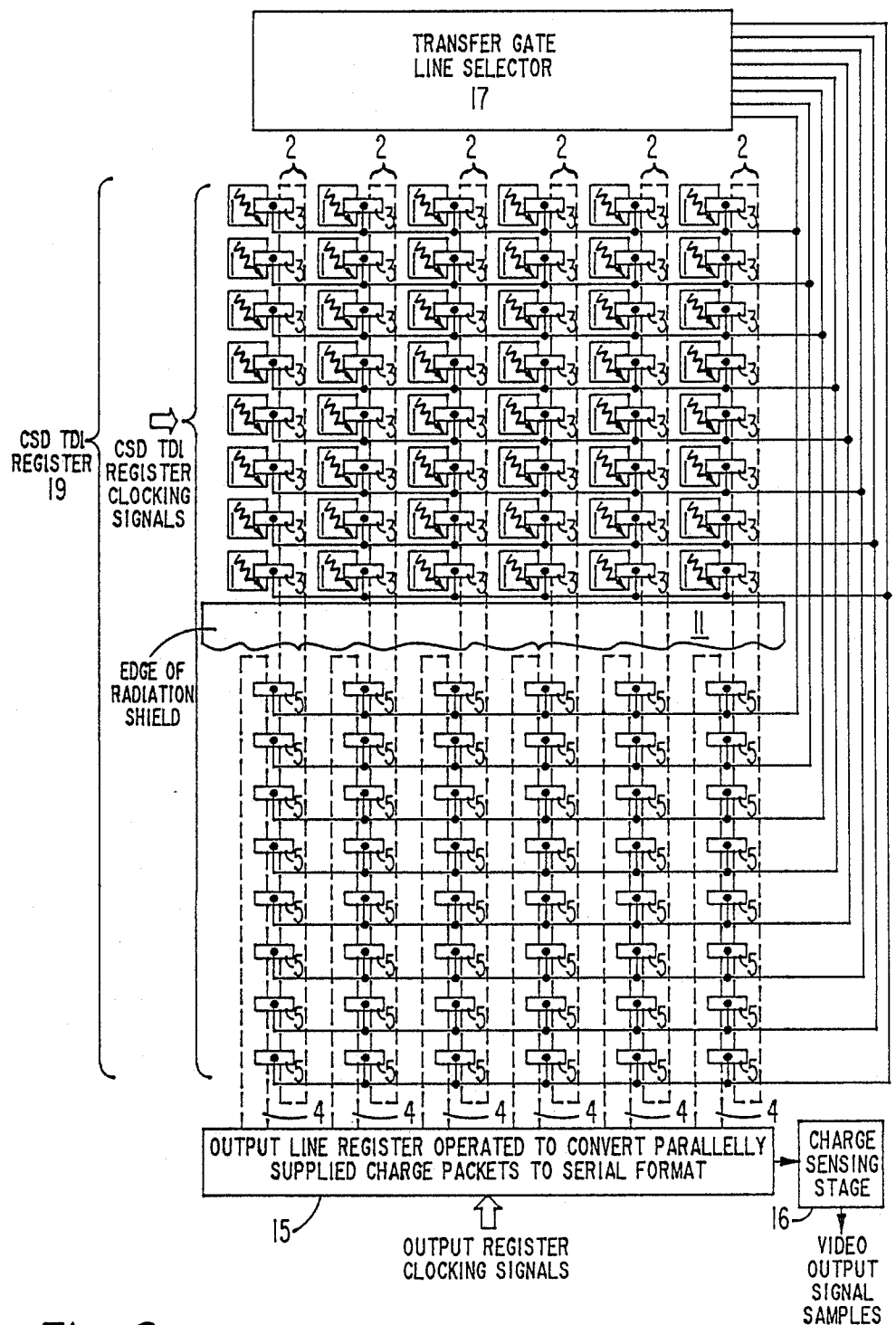
FIG. 8 is a block schematic of another infrared line imager embodying the invention. The charge sweep process involves the CCD storage register as well as the transfer register in the photosensing area of the imager.
Figure 9B:
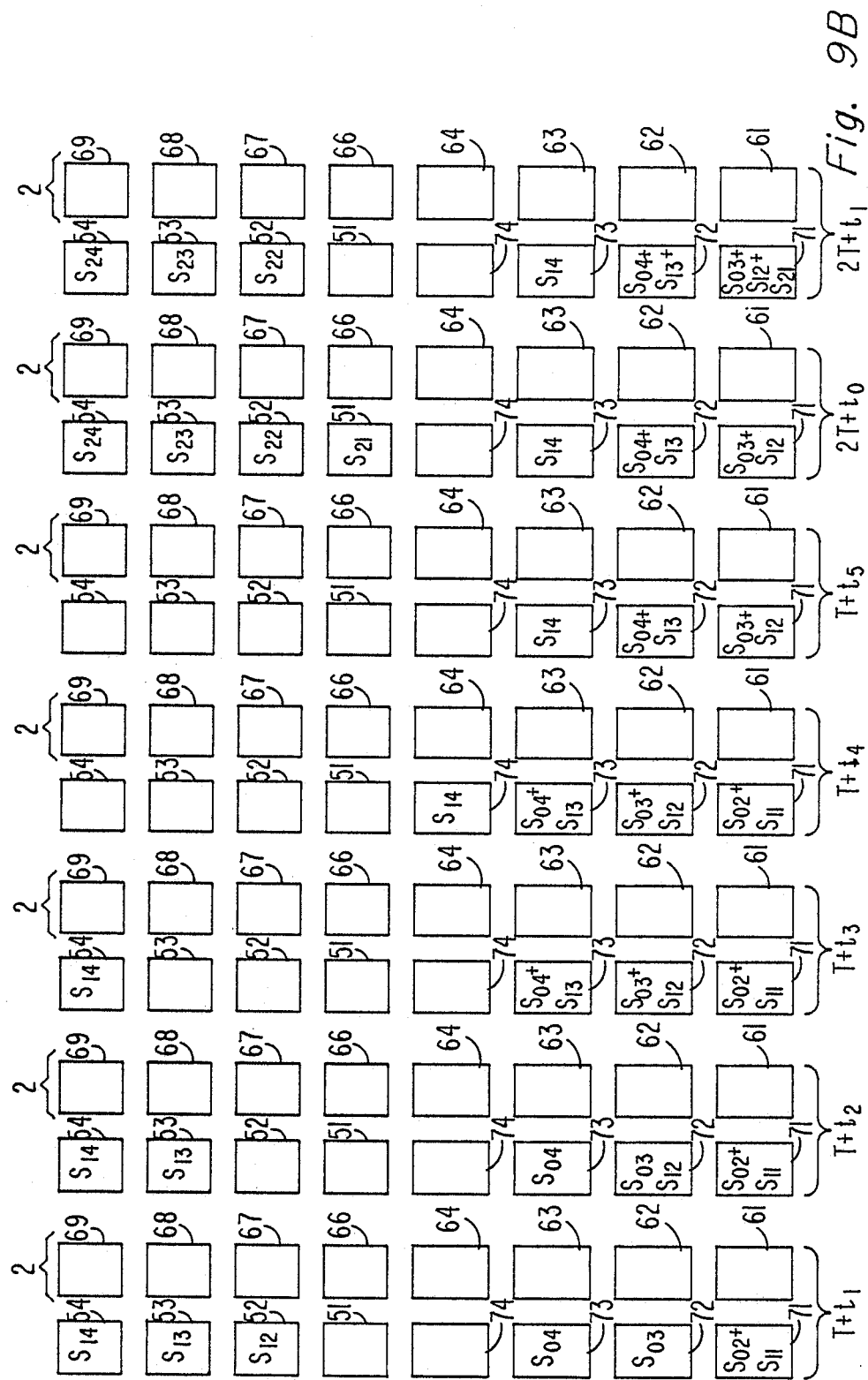

FIG. 8 shows a modification of the FIG. 1 imager in which charge-sweep-device operation is extended into the CCD storage register 10 of FIG. 1. That is, registers 14 and 10 merge into one charge-sweep-device time-delay-integration register 19. The charge transfer stages in the charge transfer channels 4 provide the collecting wells for CSD operation in FIG. 7, so storage gate electrode 12, storage control gate electrode 13 and the widening of charge transfer channels 2 to accommodate charge storage under gate electrode 12 are dispensed with. The transfer gate line selector 17 controls each successive row of transfer gates 3 in parallel with each successive row of transfer gates 5 in the CSD TDI register 19, so there is no need for a separate transfer gate line selector for the transfer gates 5. (Since there is no need to photoconvert impinging radiation in charge transfer channels 4, one may make the transfer gates 5 continuous structures crossing over the charge transfer channels 4 and the extensions of charge transfer channels 2 into register 19 rather than discrete transfer gates 5 as shown in FIG. 8.)

FIGS. 9A-D, are a timing diagram for a simplified FIG. 8 imager. The operation carried out recurrently at intervals T is as follows, in modulo-T time.

A charge sweep operation takes place between times $t_0$ and $t_4$, during which time forward clocking is halted in charge transfer channels 4. Between times $t_0$ and $t_1$ the transmission gates 5 connecting the first row of charge transfer stages in register 19 charge transfer channel 2 extensions, including 61, to corresponding charge transfer stages in charge transfer channels 4, including 71, are pulsed to lower the potential energy barriers to charge transfer otherwise induced thereunder. Charge sweep is from photosensor 51 all the way to charge charge transfer stage 71.

The accumulated photocharge is then swept from the other rows of photosensors 1 to fill corresponding rows of charge transfer stages in the charge transfer channels 4, in an analogous manner to the way charge packets were swept from the first row of photosensor 1. Between times $t_1$ and $t_2$ charge sweep operation of register 19 removes accumulated photocharge from photosensor 52 to charge transfer stage 72. Between times $t_2$ and $t_3$ charge sweep operation of register 19 removes accumulated photocharge from photosensor 53 to charge transfer stage 73. Between times $t_3$ and $t_4$ charge sweep operation of register 19 removes accumulated photocharge from photosensor 54 to charge transfer stage 74. The charge packets swept into charge transfer stages 71–74 merge with any charge packets previously stored therein.

Between times $t_4$ and $t_5$ the charge packets in charge transfer channels 4 are advanced one stage. $S_{O4}$ is transferred from charge transfer stage 74 to the succeeding stage 73; $S_{O3}$ is transferred from stage 73 to the succeeding stage 72; and $S_{O2}$ is transferred from stage 72 to the succeeding stage 71. The line of charge packets (includin $S_{O1}$) transferred out of register 19 side-loads the output line register 15.

One of the advantages of the FIG. 1 and FIG. 8 imagers is that one may select an operating mode from amongst a range of different TDI modes and a staring mode by making simple changes in the programming of the clocking voltages in their area array registers (10 and 14 in FIG. 1 imager, 19 in FIG. 8 imager). That is, one, two or four of the photosensors 1 in each column can be associated with a respective pixel, rather than each column of eight photosensors 1 being included in a single pixel. Accordingly, the FIG. 1 and FIG. 8 imagers can be operated to accommodate variation in the average intensity of imager illumination. This accommodation can be taken advantage of using operator-control or automatic-control systems.

Other variants of the FIG. 1 imager are possible, of course. The intermediate line storage register which storage and storage-control gate electrodes 12, 13 provide for may be replaced by an intermediate storage register capable of storing a few successive lines of charge packets, for example.

Figure 10:
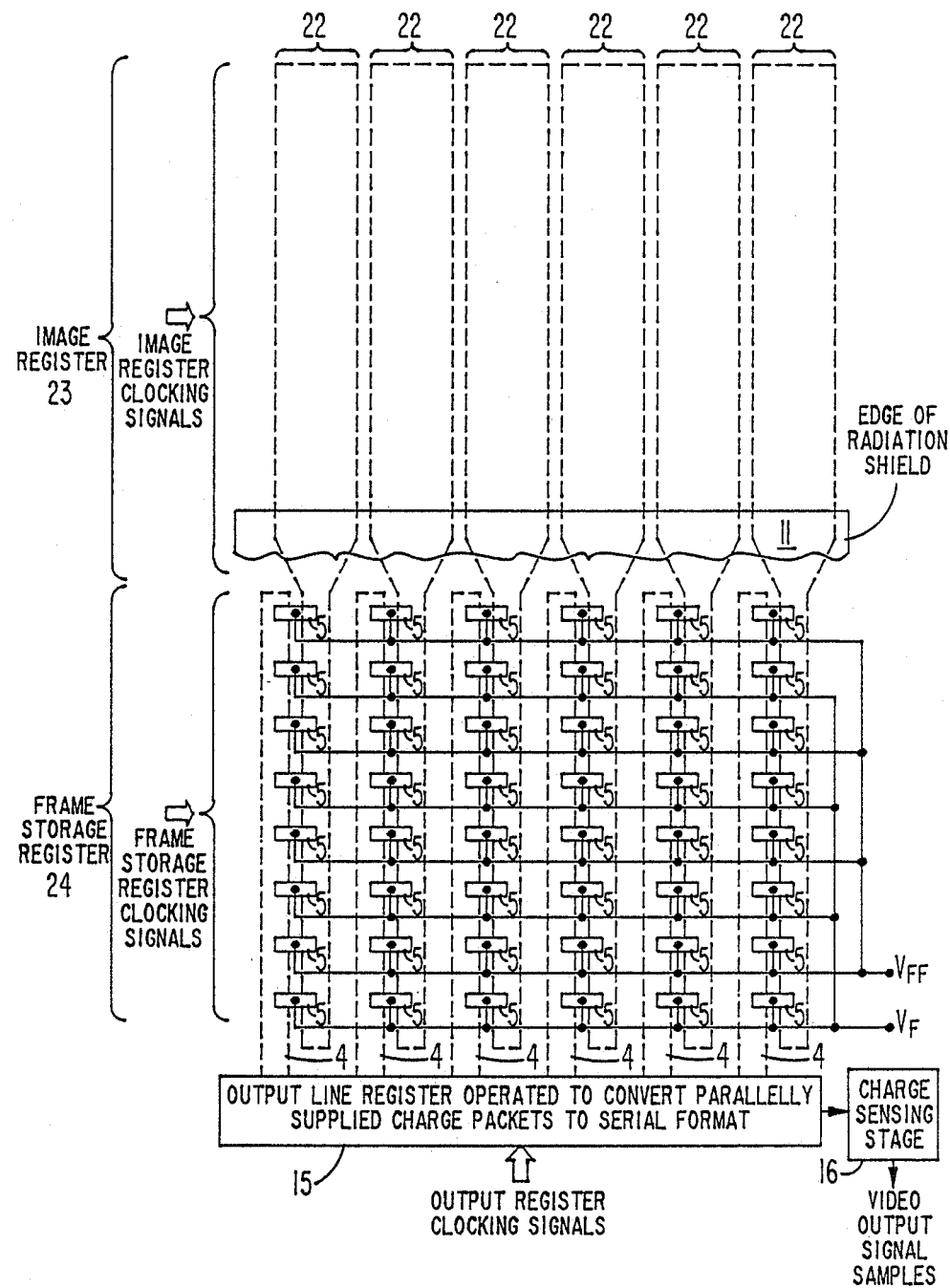
FIG. 10 is a block schematic diagram of a frame-transfer CCD imager embodying the invention, using a frame-storage register with the capability of providing true line interlace from field to field.

The FIG. 10 CCD imager is a frame-transfer type. Image integration takes place directly in the successive charge transfer stages of the charge transfer channels 22 of an image (or A) register 23, over each field interval just as in prior art frame-transfer CCD imagers. As in prior art frame-transfer imagers, rows of charge packets are successively transferred from image register 23 during field retrace times to be temporarily stored in a frame storage (or B) register 24. During each line retrace interval during field scan a successive row of charge packets from the frame storage register 24 side-loads the successive charge transfer stages of the output line (or C) register 15. Then, during the succeeding line trace interval, output line register 15 is forward clocked at pixel scan rate in shift-register operation to supply charge packets serially to charge sensing stage 16. Charge sensing stage 16 responds to each charge packet to generate a respective sample of a video output signal.

Frame storage register 24 has a structure similar to storage register 10 of the FIG. 1 imager, but is modified so that odd-numbered rows of transfer gate electrodes 5 receive a control voltage $V_F$ and even-numbered rows of transfer gates 5 receive a control voltage $V_{FF}$, rather than all transfer gate electrodes receiving a control voltage $V_{TG}$ in common. This allows transfer operations between charge transfer stages in charge transfer channel 22 extensions and corresponding charge transfer stages in charge transfer channels 4 to be carried out on an alternate-line basis. This permits the FIG. 10 imager to employ true line interlace from field to field, in which type of line interlace each line of charge packets has a full frame time to accumulate. True line interlace is preferred when there is relatively little fast motion and a large amount of fine detail in the image presented to the camera employing the solid state imager.

Alternatively, the FIG. 10 imager can be operated to provide pseudo line interlace from field to field. With pseudo line interlace each line of charge packets supplied to charge sensing stage 16 has only one field time (one half a frame time) in which to accumulate. Each line of charge packets is generated by adding charge packets from pairs of successive charge transfer stages in charge transfer channels 22, with pair phasing being alternated from field to field. Pseudo line interlace is preferred when there is a substantial amount of fast motion and little fine detail in the image presented to the camera employing the solid state imager.

In an imager where image integration is carried out in the charge transfer stages of the image register CCDs themselves, all integrated charge packets must be transferred out of the image register during each field retrace interval. It is this requirement that forestalls true line interlace operation in prior art frame-transfer CCD imagers, owing to their frame storage registers being strictly serial memories. In the FIG. 10 imager, all charge packets integrated in the charge transfer stages of the image register are transferred out during each field retrace interval. The image register 23 has as many rows of parallel charge transfer stages in its CCD charge tansfer channels as there are active lines in a frame. Frame storage register 24, unlike the prior art serial-memory frame storage registers, has the property of being able to rearrange the order in which lines of charge packets integrated over a field time pass through it. This is owing to register 24 having auxiliary storage capabilities provided by the pairs of adjoining charge transfer channels between the corresponding charge transfer stages of which parallel charge transfers can be made.

Figure 11B:
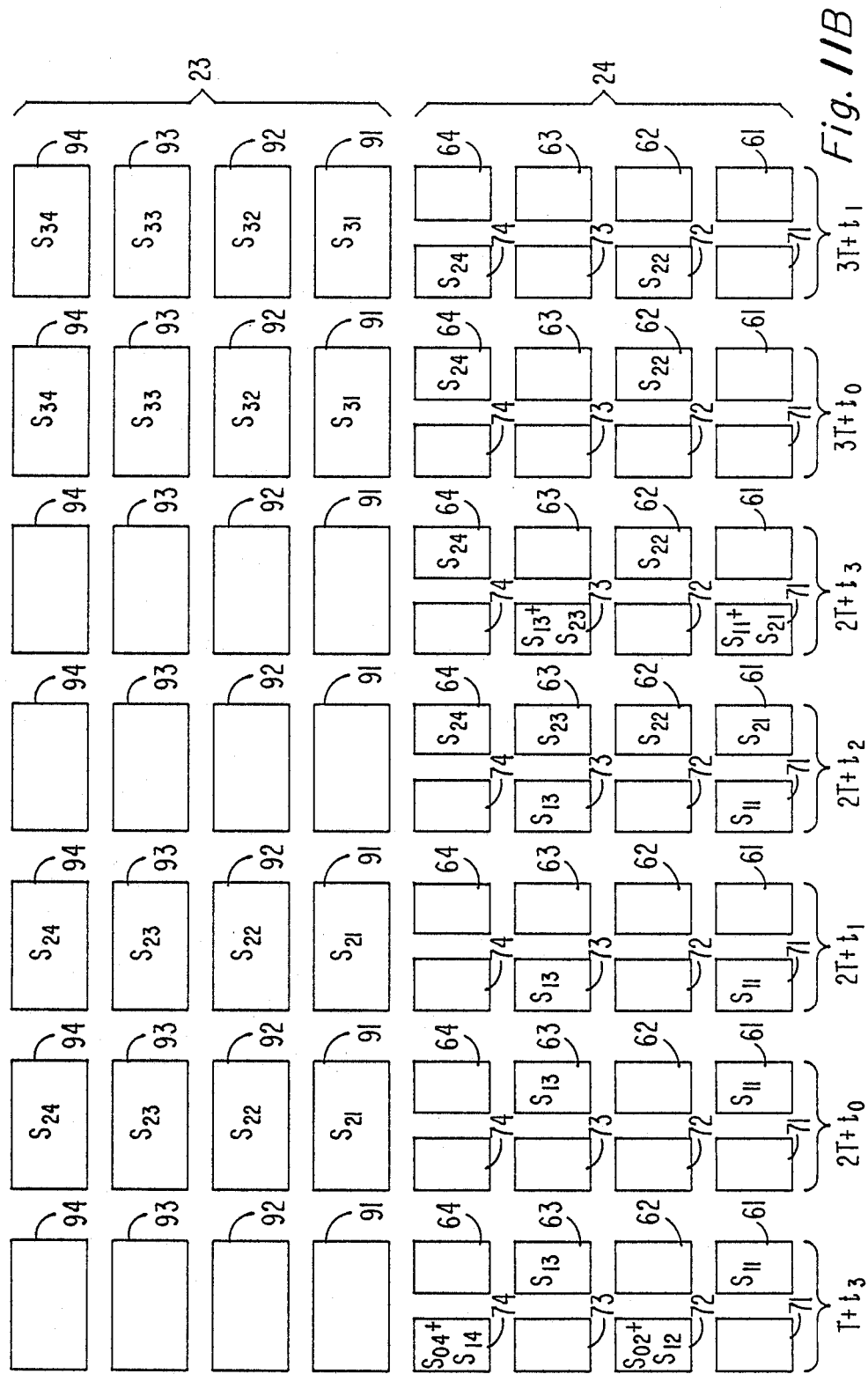

FIGS. 11A and 11B are a timing diagram for the FIG. 10 imager showing a way to achieve true line interlace from field to field. In these figures boxes 91–94 represent charge transfer stages in the image register. They clock charge packets forward during frame transfer into the successive charge transfer stages 61–64 of extension of charge transfer channels 22 into field storage register 24, which stages 61–64 have means for selectively connecting them to corresponding charge transfer stages 71–74 in one of charge transfer channels 4 for charge transfer. The recurrent cycle of operation that occurs over a frame time 2T can be described as follows in modulo-2T time measured from time $t_0$.

At a time $t_0$ just prior to frame transfer, an odd field of image samples has accumulated over the preceding field time in image-register 23 charge transfer stages 91–94. Between times $t_0$ and $t_1$, the charge packets descriptive of pixels in odd-numbered scan lines, which were accumulated in the field preceding that just past, are transferred to charge transfer channels 4 from the extensions of charge transfer channels 22 into frame storage register 24. This includes a transfer of the charge packets contained in charge transfer stages 61 and 63, respectively, to charge transfer stages 71 and 73, respectively. Then, during field transfer taking placing between times $t_1$ and $t_2$, while charge transfer channels 4 are not forward clocked, charge transfer channels 22 are forward clocked. This transfers charge packets from charge transfer stages 91–94 to charge transfer stages 61–64, respectively.

Between times $t_2$ and $t_3$, charge packets in alternate rows of charge transfer stages in the portions of charge transfer channels 22 extending into frame storage register 24 (i.e., those charge packets descriptive of odd-numbered line scans) are transferred to corresponding charge transfer stages in charge transfer channels 4. This is done responsive to a $V_F$ pulse. E.g., the charge packets in charge transfer stages 61 and 63 are transferred to charge transfer stages 71 and 73, respectively, to merge with charge packets already in charge transfer stages 71 and 73 which describe pixels in odd-numbered scan lines at one field earlier time.

In the field trace interval between time $t_3$ and $T+t_0$, the charge packets in the charge transfer stages (including 71–74) of the charge transfer channels 4 are advanced by one charge transfer stage, initially, and then by two charge transfer stages each line retrace interval. A line of charge packets displaced from frame storage register 24 by this forward clocking procedure side-loads the successive charge transfer stages of output line register 15 during line retrace interval. Then, in each ensuing line trace interval, output line register 15 is forward clocked at pixel-scan rate, to supply charge packets serially to charge sensing stage 16 for conversion to video output signal samples. This empties charge transfer channels 4 of pixel-descriptive charge packets.

At time $T+t_0$, the end of the field trace interval, new charge packets descriptive of respective image pixels have accumulated in image register 23. Such charge packets have accumulated in charge transfer stages 91–94 by way of example.

Between times $T+t_0$ and $T+t_1$ the charge packets descriptive of pixels in even-numbered lines accumulated in the field preceding that just past are transferred from charge transfer channels 22 to charge transfer channels 4. This includes transfers of the charge packets contained in charge transfer stages 62 and 64 to charge transfer stages 72 and 74; respectively. Between times $T+t_1$, and $T+t_2$ the charge packets accumulated over the previous field in the portions of charge transfer channels 22 in image register 23 are advanced by high-rate forward clocking into the portions of these channels 22 in frame storage charge transfer stages 91–94 into charge transfer stages 61–64, respectively.

Between times $T+t_2$ and $T+t_3$, charge packets in alternate rows of charge transfer stages in the portions of charge transfer channels 22 extending into frame storage register 24 (i.e. those charge packets descriptive of even-numbered line scans) are transferred to corresponding stages in charge transfer channels 4. This is done responsive to a $V_{FF}$ pulse. E.g., the charge packets in charge transfer stages 62 and 64 are transferred to charge transfer stages 72 and 74, respectively, to merge with the charge packets already in charge transfer stages 72 and 74 which describe pixels in even-numbered scan lines at one field earlier time.

In the field trace between times $T+t_3$ and $2T+t_0$, the charge packets in the charge transfer stages (including 71–74) of the charge transfer channels 4 are advanced by two charge transfer stages, initially, and then by two charge transfer stages each line retrace interval. The line of charge packets displaced from frame storage register 24 by this forward clocking procedure each line retrace interval side-loads the successive charge transfer stages of output line register 15. Then, in each ensuing line trace interval output line register 15 is forward clocked at pixel-scan rate, to supply charge packets serially to charge sensing stage 16 for conversion to video output signal samples. This empties charge transfer channels 4 of pixel-descriptive charge packets.

FIG. 12 depicts one way FIG. 10 CCD imager can be operated, alternatively, to provide pseudo field-to-field line interlace. In pseudo line interlace the pixels in each scan line are accumulated over only one field time, rather than a full frame time. Operation of output line register 15 remains unchanged. Operation in modulo-2T time, measured from time $t_0$, of image register 23 and frame storage register 24 is as follows.

At time $t_0$, a field of pixel-descriptive charge packets has been accumulated over a field scan interval in the portions of charge transfer channels 22 in image register 23. A representative one of these charge transfer channel 22 portions includes the charge transfer stages 91–94. Between times $t_0$ and $t_1$, the pixel-descriptive charge packets are advanced to charge transfer stages (including 61–64) in the portions of charge transfer channels 22 in frame storage register 24. Then between times $t_1$ and $t_2$, these pixel-descriptive charge packets are transferred to corresponding charge storage stages (including 71–74) in charge transfer channels 4, by pulsing $V_F$ and $V_{FF}$. Thereafter, during odd field scan interval charge packets are advanced two charge transfer stages in charge transfer channels and then two additional charge transfer stages each line retrace interval. Transfer stages each line retrace interval. The line of charge packets displaced from frame storage register 24 by this forward clocking procedure each line retrace interval side-loads the successive charge transfer stages of output line register 15. Then, in each ensuing line trace interval output line register 15 is forward clocked at pixel-scan rate, to supply charge packets serially to charge sensing stage 16 for conversion to video output signal samples. This empties charge transfer channels 4 of pixel-descriptive charge packets.

Selection can be made between true line interlace and pseudo line interlace of the FIG. 10 imager. This selection can be made based on the motion and detail contents of the images the FIG. 10 imager is likely next to receive.

Figure 13:
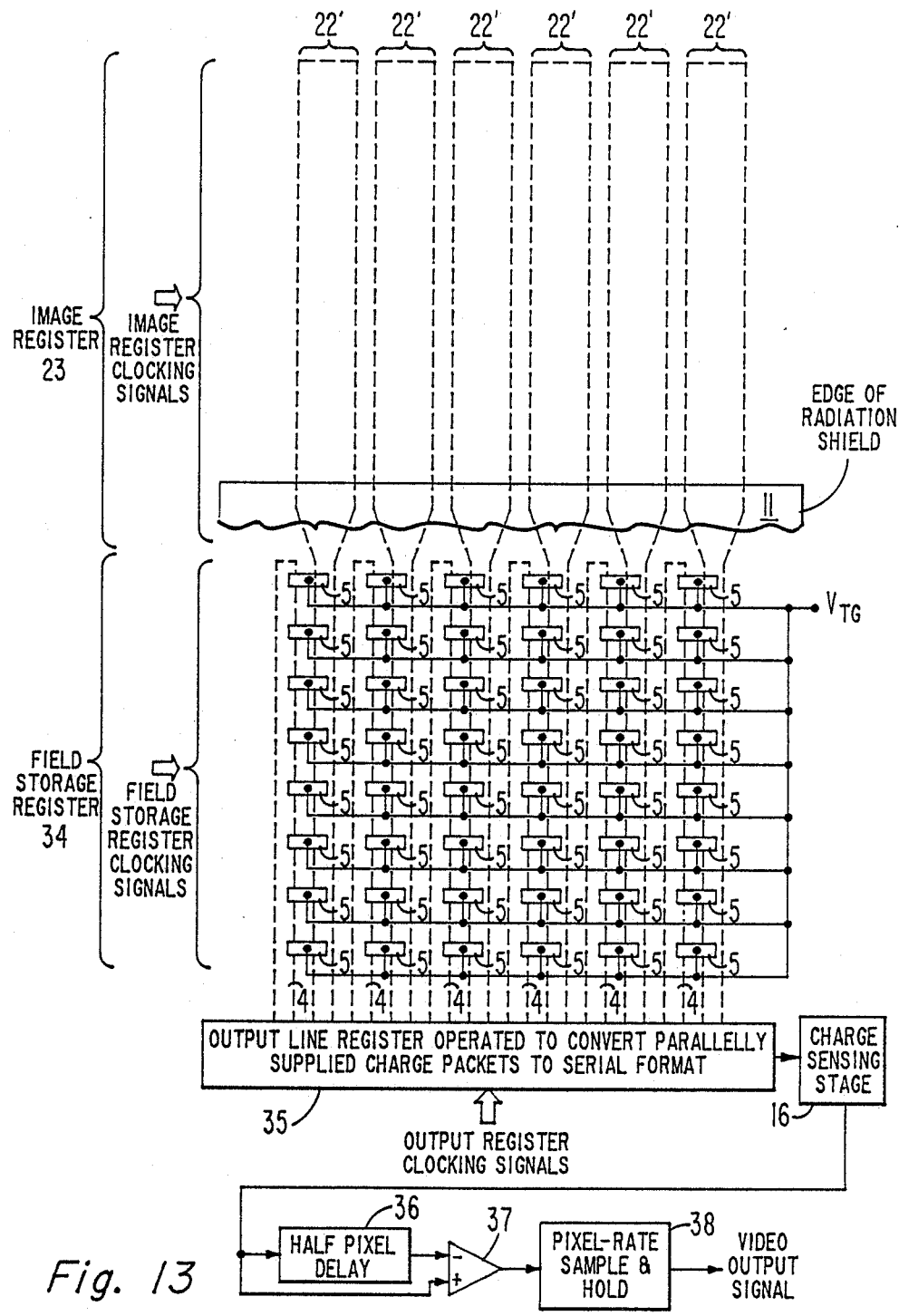
FIG. 13 is a block schematic diagram of a field-transfer CCD imager embodying the invention. The imager is connected in combination with apparatus for suppressing dark-current ramp and transfer smear, as proposed by R. A. Dischert and A. L. R. Limberg, coworkers of the inventor.

FIG. 13 shows a CCD imager embodying the present invention, followed by circuitry comprising elements 36, 37, 38 employed by the inventor's co-workers R. A. Dischert and A. L. R. Limberg in their invention to suppress dark-current ramp and transfer smear.

FIG. 13 CCD imager differs from FIG. 10 CCD imager in the following ways. A field storage register 34 replaces frame storage register 24. Output line register 15 is replaced by an output line register 35 with twice as many charge transfer stages. The output ports of charge transfer channels 4 side-load alternate ones of the charge transfer stages of output line register 35, and the other charge transfer stages of output line register 35 are side-loaded from output ports of portions of charge transer channels 22' extending past field storage register 34. During line retrace intervals output line register 35 is clocked at twice pixel-scan rate to supply charge packets serially to charge sensing stage 16.

In operation, image register 23 is erased of charge near the close of each field retrace interval to remove one source of transfer smear. Pixel-descriptive charge packets are accumulated during each field trace interval. In the earlier half of each field retrace interval these charge packets are advanced in charge transfer channels 22' from image register 23 to field storage register 34. $V_{TG}$ pulse is applied to transfer the pixel-descriptive charge packets from charge transfer stages in the portions of charge transfer channels 22' in field storage register 34 to corresponding charge transfer stages in charge transfer channels 4, and image register 23 is again erased of charge. Then, image register 23 is read out a second time to move a column of null charge packets into the charge transfer stages of charge transfer channels 22' within field storage register 34. If image register 23 is unshuttered during field retrace intervals, these null charge packets will have transfer smear components accompanying them similar to those accompanying the pixel-descriptive charge packets in the adjoining charge transfer channel 4.

During each field trace interval charge packets are advanced a row each line retrace interval, side-loading output line register 35. The forward clocking of output line register 35 at twice pixel-scan rate, during the ensuing line trace interval, generates pixel-descriptive samples interleaved with null samples at charge sensing stage 16 output. These samples have common-mode transfer smear and dark-current ramp components. These common-mode components are suppressed by differentially combining in differential-input amplifier 37 the undelayed samples supplied by charge sensing stage 16 and those samples as subjected to a half-pixel delay 36. The output signal of amplifier 37 is sampled and held at pixel-scan rate to supply video output signal with substantially reduced transfer smear and dark-current ramp components.

For purposes of claiming any one of the extended charge transfer channels 2 of FIG. 1, the extended charge transfer channels 22 of FIG. 10, or the extended charge transfer channels 22' may be viewed as comprising two charge transfer channels in serial connection. The first of these two charge transfer channels is in the image register (14 or 23), with its output port connecting to the input port of the second of these charge transfer channels, which is in the field storage register (10, 24 or 34).

What is claimed is:

1. A charge-coupled-device (CCD) storage register located along a surface of a substrate of semiconductor material, said CCD storage register comprising:
    a first set of CCD charge transfer channels arranged in a first parallel array with intervening spaces, said first set of CCD charge transfer channels having respective input ports in parallel alignment with each other and having respective successions of charge transfer stages arranged in rows;
    a second set of CCD charge transfer channels, each located in a respective space adjacent to a corresponding one of said first set of CCD charge transfer channels, with no intermediate charge packet storage locations between any one of said first set of charge transfer channels and the corresponding one of said second set of charge transfer channels, said second set of CCD charge transfer channels having respective successions of charge transfer stages also arranged in said rows and having respective output ports in parallel alignment;
    means for parallelly transferring successive lines, or ranks, of charge packets into the input ports of said first set of charge transfer channels;
    means for parallelly advancing charge packets in rows of charge transfer stages in said first set of CCD charge transfer channels to suceeding ones of those rows;
    transfer gate electrode structures between corresponding ones of said first and second charge transfer channels, receptive of pulsed voltages for selectively transferring ranks of charge packets from ones of the charge transfer stages in each of said first set of CCD charge transfer channels to adjacent charge transfer stages in the same row and in said adjacent one of said second set of CCD channels, which transfer gate electrode structures implement exclusive means for transferring charge packets into said second set of CCD charge transfer channels, the selective transferring taking place between selected ones of the advances of ranks of charge packets in said first set of CCD charge transfer channels; and
    means for parallelly advancing each rank of charge packets transferred into said second set of CCD charge transfer channels through said second set of CCD charge transfer channels to be supplied from their output ports.

2. A charge-coupled-device (CCD) storage register located along a surface of a substrate of semiconductor material, said CCD storage register comprising:
    a first set of CCD charge transfer channels arranged in a first parallel array with intervening spaces, said first set of CCD charge transfer channels having input ports in parallel alignment with each other and having output ports;
    a second set of CCD charge transfer channels, each located in a space adjacent to a corresponding one of said first set of CCD charge transfer channels, said second set of CCD charge transfer channels having output ports in parallel alignment with each other and with the output ports of said first set of charge transfer channels;

means for parallelly transferring charge packets into the input ports of said first set of charge transfer channels;

means for selectively transferring charge packets from ones of the charge transfer stages in each of said first set of CCD charge transfer channels to adjacent charge transfer stages in said adjacent one of said second set of CCD channels; and means for parallelly transferring charge packets from the output ports of said second set of charge transfer channels - and said CCD storage register being connected in combination with:

a CCD line register having a succession of charge transfer stages in a charge transfer channel thereof parallelly loaded at prescribed time intervals from respective ones of the parallelly aligned output port of said first and second sets of charge transfer channels in said storage register; and means for operating said CCD output line register as a shift register at times other than said prescribed loading time intervals to supply charge packets in serial format from an output port of said CCD line register, whereby said CCD line register is operative as a converter from parallel charge packet format to serial charge packet format.

3. A combination as set forth in claim 2 including:
means for sensing the amplitudes of charge packets passing through the output port of said CCD line register.

4. A combination as set forth in claim 3 included within a solid state imaging device which also includes:
means for converting a radiant energy image into successive rows of charge packets sequentially applied to the input ports of the first set of charge transfer channels in said CCD storage register.

5. A solid-state imaging device as set forth in claim 4 wherein said means for converting a radiant energy image into successive rows of charge packets includes:
an image register having a plurality of CCD charge transfer channels with output ports each connected to a respective one of said first set of charge transfer channels in said CCD storage register, each CCD charge transfer channel in said image register having a succession of charge transfer stages therein in which photogenerated charge generated by photoconversion of respective radiant energy image elements is collected into packets, there being at least substantially as many charge transfer stages in each charge transfer channel of said first set of CCD charge transfer channels in said CCD storage register as there are charge transfer stages in each charge transfer channel in said image register.

6. A charge-coupled-device (CCD) storage register, located along a surface of a substrate of semiconductor material, said CCD storage register comprising:
a first set of CCD charge transfer channels arranged in a first parallel array with intervening spaces, said first set of CCD charge transfer channels having input ports in parallel alignment with each other;
a second set of CCD charge transfer channels, each located in a space adjacent to a corresponding one of said first set of CCD charge transfer channels, said second set of CCD charge transfer channels having output ports in parallel alignment;

means for parallelly transferring charge packets into the input ports of said first set of charge transfer channels;

means for selectively transferring charge packets from ones of the charge transfer stages in each of said first set of CCD charge transfer channels to adjacent charge transfer stages in said adjacent one of said second set of CCD channels; and means for parallelly transferring charge packets from the output ports of said second set of charge transfer channels—and said CCD storage register being in combination with:

a CCD line register having a succession of charge transfer stages in a charge transfer channel thereof parallelly loaded at prescribed loading time intervals from respective ones of the output ports of said second set of charge transfer channels in said CCD storage register; and means for operating said CCD output line register as a shift register as times other than said prescribed loading time intervals to supply charge packets in serial format from an output port of said CCD line register, whereby said CCD line register is operative as a converter from parallel charge packet format to serial charge packet format.

7. A combination as set forth in claim 6 including:
means for sensing the amplitudes of charge packets passing through the output port of said CCD line register.

8. A combination as set forth in claim 7 included within a solid state imaging device which also includes:
means for converting a radiant energy image into successive rows of charge packets sequentially applied to the input ports of said first set of charge transfer channels in said CCD storage register.

9. A solid-state imaging device as set forth in claim 8 wherein said means for converting a radiant energy image into successive rows of charge packets includes:
an array of photosensors arranged by row and by column for collecting charge packets responsive to respective elements of a radiant energy image impinging on said photosensors, the number of columns equalling the number of charge transfer channels in said first set of charge transfer channels in said CCD storage register, and the number of rows being substantially equal to the number of charge transfer stages in each charge transfer channel of said CCD storage register;

a respective CCD charge transfer channel operated as a charge-sweeping column register for each column of said array of photosensors, having a corresponding charge transfer stage for each photosensor in its respective column of photosensors and having an output port connecting to the input port of a respective one of said first set of charge transfer channels in said CCD storage register; and means for selectively transferring charge packets collected in said array of photosensors from one selected row at a time into the corresponding charge transfer stage of its charge-sweeping column register CCD charge transfer channel.

10. A solid-state imaging device as set forth in claim 9 wherein each said CCD charge transfer channel operated as a charge-sweeping column register is crossed by a storage gate electrode and a storage control gate electrode prior to its output port, said storage gate electrode and storage gate electrode receptive of voltages for causing the re-integration of charge swept from each row of photosensors along said column registers into packets and then causing the transfer of the re-integrated charge packets in parallel into the input ports of said first set of charge transfer channels in said CCD storage register.

11. A solid-state imaging device as set forth in claim 10 wherein said CCD storage register is operated to provide time-delay-integration operation of said solid-state imaging device.

12. A solid-state imaging device as set forth in claim 9 wherein each said CCD charge transfer channel operated as a charge-sweeping column register is synchronously forward clocked with said first set of charge transfer channels in said CCD storage register during each charge sweep; and wherein in said CCD storage register said means for selectively transferring charge packets is operative on a per row of charge transfer stages selection basis; with row selection being related to row selection in said means for transferring charge packets collected in said array of photosensors.

13. A solid-state imaging device as set forth in claim 12 wherein said CCD storage register is operated to provide time-delay-integration operation of said solid-state imaging device.

14. A solid-state imaging device as set forth in claim 8 wherein said means for converting a radiant energy image into successive rows of charge packets includes:
an image register having a plurality of CCD charge transfer channels with output ports each connected to a respective one of the set of charge transfer channels in said CCD storage register, each CCD charge transfer channel in said image register having a succession of charge transfer stages therein in which photogenerated charge generated by photoconversion of respective radiant energy image elements is collected into packets, there being at least substantially as many charge transfer stages in each of the plurality of CCD charge transfer channels in parallel array in said CCD storage register as there are charge transfer stages in each charge transfer channel in said image register.

15. A solid-state imaging device as set forth in claim 14 wherein said CCD storage register is operated to provide field-to-field line interlace.

16. A CCD storage register as set forth in claim 1 wherein all the charge packets transferred into the input ports of said first set of charge transfer channels are selectively transferred to said second set of charge transfer channels.

17. A CCD storage register as set forth in claim 1 wherein only selected ranks of the charge packets transferred into the input ports of said first set of CCD charge transfer channels are selectively transferred to said second set of CCD charge transfer channels, and wherein said means for parallelly advancing the ranks of charge packets parallelly transferred into the input ports of said first set of charge transfer channels advances the remaining ones of those lines of charge packets through said first set of CCD charge transfer channels to be supplied from respective output ports thereof, which are in parallel alignment with each other.

* * * * *